United States Patent
Kim et al.

(10) Patent No.: US 10,411,045 B2
(45) Date of Patent: Sep. 10, 2019

(54) DISPLAY DEVICE

(71) Applicant: Samsung Display Co., Ltd., Yongin-si (KR)

(72) Inventors: Byoung Yong Kim, Seoul (KR); Jeong Ho Hwang, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 48 days.

(21) Appl. No.: 15/696,303

(22) Filed: Sep. 6, 2017

(65) Prior Publication Data

US 2018/0076235 A1 Mar. 15, 2018

(30) Foreign Application Priority Data

Sep. 9, 2016 (KR) .......... 10-2016-0116732

(51) Int. Cl.
*H01L 27/12* (2006.01)
*H01L 23/00* (2006.01)
*G02F 1/1345* (2006.01)

(52) U.S. Cl.
CPC ...... *H01L 27/1244* (2013.01); *G02F 1/13452* (2013.01); *H01L 24/06* (2013.01); *H01L 2224/06051* (2013.01); *H01L 2224/06163* (2013.01); *H01L 2224/06165* (2013.01); *H01L 2224/06515* (2013.01)

(58) Field of Classification Search
CPC .......... H01L 27/1244; H01L 24/06; H01L 2224/06515; H01L 2224/06165; H01L 2224/06051; H01L 2224/06163
USPC .......................................... 257/72
See application file for complete search history.

(56) References Cited

U.S. PATENT DOCUMENTS

| | | | |
|---|---|---|---|
| 9,947,692 B2 * | 4/2018 | Lee | G09G 3/3648 |
| 10,091,876 B2 * | 10/2018 | Kim | H05K 1/18 |
| 2015/0228706 A1 | 8/2015 | Lee | |
| 2016/0066409 A1 | 3/2016 | Kwon et al. | |
| 2016/0133550 A1 | 5/2016 | Chen | |
| 2016/0181345 A1 | 6/2016 | Lee et al. | |
| 2018/0014405 A1 * | 1/2018 | Kim | H01L 24/29 |
| 2018/0020543 A1 * | 1/2018 | Kim | G02F 1/13452 |

FOREIGN PATENT DOCUMENTS

| | | |
|---|---|---|
| KR | 10-1394920 | 5/2014 |
| KR | 10-2015-0094829 | 8/2015 |

* cited by examiner

*Primary Examiner* — Caleen O Sullivan
(74) *Attorney, Agent, or Firm* — H.C. Park & Associates, PLC

(57) ABSTRACT

A display device includes a substrate and a first pad. The substrate includes a display area to display an image, and a pad area outside the display area. The first pad is in the pad area, and includes first pad terminals extending parallel to one another in a first direction. The first pad terminals include: first connection pad terminals arranged along a first column that forms a first slope angle with the first direction; second connection pad terminals spaced apart from the first connection pad terminals and arranged along a second column that forms a second slope angle with the first direction; and a first dummy pad terminal between a pair of adjacent first connection pad terminals among the first connection pad terminals along the first column. The first dummy pad terminal and the first connection pad terminals are in different layers than one another.

27 Claims, 29 Drawing Sheets

DISPLAY DEVICE

CROSS-REFERENCE TO RELATED APPLICATION

This application claims priority from and the benefit of Korean Patent Application No. 10-2016-0116732, filed Sep. 9, 2016, which is hereby incorporated by reference for all purposes as if fully set forth herein.

BACKGROUND

Field

Exemplary embodiments relate to a display device.

Discussion

Display devices include, for example, liquid crystal display (LCD) devices, plasma display panel (PDP) devices, organic light emitting diode (OLED) display devices, field emission display (FED) devices, electrophoretic display devices, and the like. Among these display devices, an OLED display device typically includes two electrodes and an organic emission layer positioned therebetween, and emits light in response to an electron injected from one electrode and a hole injected from the other electrode being recombined with each other in the organic emission layer to form an exciton that discharges energy in the form of light. In this manner, an OLED display device may be considered as having a self-luminance characteristic, and, thereby, does not require a separate light source unlike, for instance, an LCD device. Also, OLED display devices typically have reduced thicknesses and weight. Additionally, an OLED display device has relatively high-grade characteristics, such as low power consumption, high luminance, and high response speed.

To drive an organic light emitting element of an OLED display device, a printed circuit board is usually coupled to a peripheral area of a substrate of the OLED display device and a driving signal is received through the printed circuit board. In this manner, however, as the resolution of an OLED display device increases, the number of pad terminals coupled with the printed circuit board will also increase. When resistance of wires connected to some pad terminals of a plurality of pad terminals is increased, luminance is reduced.

The above information disclosed in this section is only for enhancement of an understanding of the background of the inventive concepts, and, therefore, it may contain information that does not form prior art already known to a person of ordinary skill in the art.

SUMMARY

Some exemplary embodiments provide a display device having an advantage of disposing a larger number of pad terminals in a peripheral area of the display device.

Some exemplary embodiments provide a display device having an advantage of preventing or reducing a likelihood of a short circuit between wires in or of the pad terminals.

Additional aspects will be set forth in the detailed description which follows, and, in part, will be apparent from the disclosure, or may be learned by practice of the inventive concepts.

According to some exemplary embodiments, a display device includes a substrate and a first pad. The substrate includes a display area to display an image, and a pad area outside the display area. The first pad is in the pad area, and includes first pad terminals extending parallel to one another in a first direction. The first pad terminals include: first connection pad terminals arranged along a first column that forms a first slope angle with the first direction; second connection pad terminals spaced apart from the first connection pad terminals and arranged along a second column that forms a second slope angle with the first direction; and a first dummy pad terminal between a pair of adjacent first connection pad terminals among the first connection pad terminals along the first column. The first dummy pad terminal and the first connection pad terminals are in different layers than one another.

Each of the plurality of first pad terminals may further include a second dummy pad terminal which is disposed between a pair of adjacent second connection pad terminals among the plurality of second connection pad terminals in the second column and disposed on a different layer from the plurality of second connection pad terminals.

At least one of the first dummy pad terminal and the second dummy pad terminal may have a plate shape having a quadrangular plane.

At least one of the first dummy pad terminal and the second dummy pad terminal may have a plate shape having a circular plane.

At least one of the first dummy pad terminal and the second dummy pad terminal may have a plate shape having an oval plane.

At least one of the first dummy pad terminal and the second dummy pad terminal may include a plurality of unit patterns which are separated from each other, and the plurality of unit patterns may be spaced apart from each other to have a circular shape.

At least one of the first dummy pad terminal and the second dummy pad terminal may include a plurality of unit patterns which are separated from each other, and the plurality of unit patterns may be spaced apart from each other to have a quadrangular shape.

The plurality of first pad terminals may further include a plurality of first terminal connection lines which connects one of the plurality of first connection pad terminals and one of the second connection pad terminals to each other and has at least one curved shape.

The plurality of first terminal connection lines may be positioned on the same layer as the plurality of first connection pad terminals.

At least one of the plurality of first terminal connection lines may be overlapped with at least one of the first dummy pad terminal and the second dummy pad terminal.

The first slope angle and the second slope angle may be the same as each other. The first slope angle and the second slope angle may be larger than 0° and smaller than 90°.

The first pad may further include a plurality of second pad terminals disposed in a second terminal area spaced apart from the first terminal area in which the plurality of first pad terminals is disposed.

The plurality of second pad terminals may include a plurality of third connection pad terminals arranged along a third column which forms the third slope angle with the first direction; and a plurality of fourth connection pad terminals which is spaced apart from the plurality of third connection pad terminals and arranged along a fourth column which forms a fourth slope angle with the first direction.

The third slope angle and the fourth slope angle may be the same as each other.

The third slope angle and the fourth slope angle may be larger than 0° and smaller than 90°.

The first slope angle and the third slope angle may be the same as each other.

The first terminal area and the second terminal area may be arranged in parallel in the first direction.

The plurality of first connection pad terminals and the plurality of second connection pad terminals may have plate shapes having quadrangular planes, respectively.

The quadrangle may include first sides parallel with the first direction and second sides adjacent to the first sides and parallel with the second direction which crosses the first direction, and the second side may be longer than the first side.

In the display area of the substrate, a plurality of data lines and a plurality of gate lines crossing the plurality of data lines may be disposed.

The plurality of first connection pad terminals may be positioned on the same layer as the plurality of data lines, and the first dummy pad terminal may be positioned on the same layer as the plurality of gate lines.

The gate line may include a first gate member and a second gate member disposed on the first gate member, and the first dummy pad terminal may be disposed on the same layer as any one of the first gate member and the second gate member.

The data line may include a first data member and a second data member disposed on the first data member, and the first connection pad terminal and the first dummy pad terminal may be disposed on the same layer as any one of the first gate member and the second gate member, respectively.

The display device may further include a printed circuit board including a base film and a second pad positioned on one side of the base film, having a shape corresponding to the first pad, and coupled with the first pad.

The printed circuit board may further include a driving chip positioned on the other side of the base film.

The base film may be flexible.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
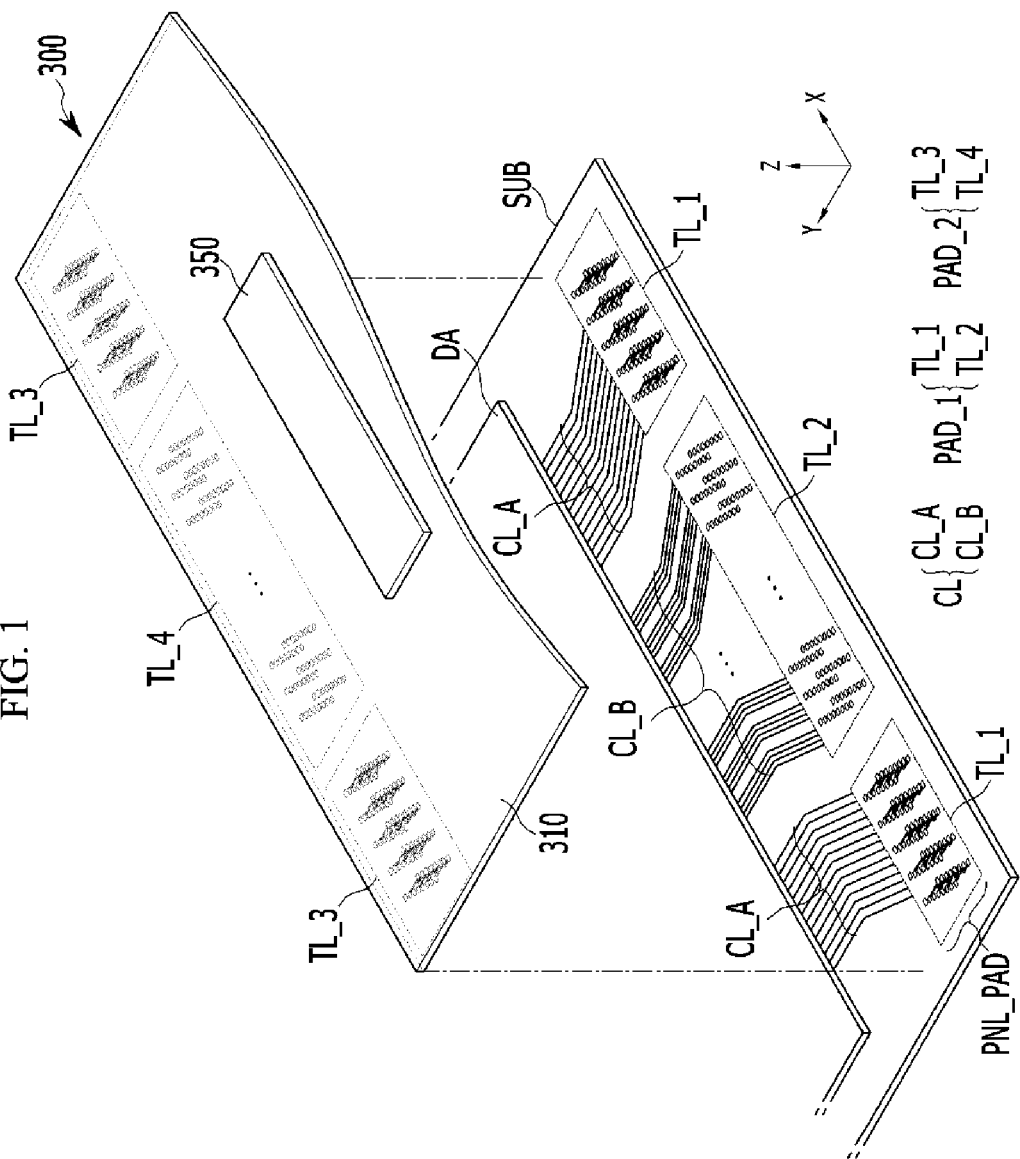
FIG. 1 is an exploded perspective view schematically illustrating a portion of a display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, aspects, etc. (hereinafter collectively referred to as "elements"), of the various illustrations may be otherwise combined, separated, interchanged, and/or rearranged without departing from the disclosed exemplary embodiments.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying figures, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Further, the X-axis, the Y-axis, and the Z-axis are not limited to three axes of a rectangular coordinate system, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
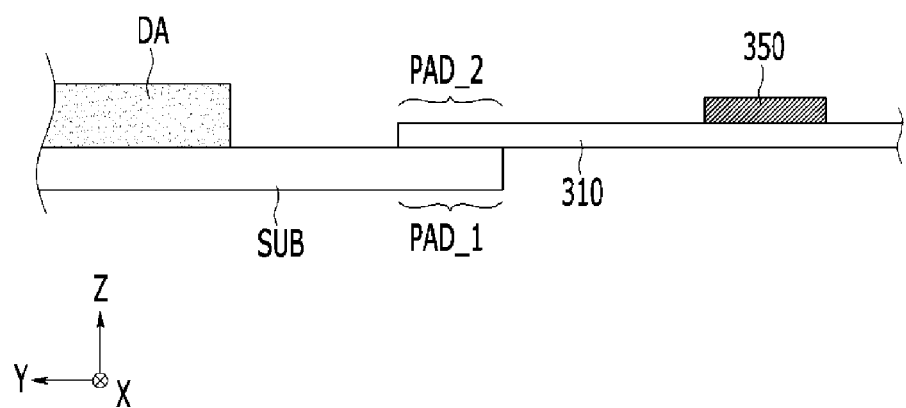
FIG. 2 is a schematic side view of the display device of FIG. 1 according to some exemplary embodiments.

FIG. 1 is an exploded perspective view schematically illustrating a portion of a display device according to some exemplary embodiments. FIG. 2 is a schematic side view of the display device of FIG. 1 according to some exemplary embodiments.

Referring to FIGS. 1 and 2, a display device may include a substrate SUB, a first pad PAD_1, and a printed circuit board 300. The first pad PAD_1 is coupled with the printed circuit board 300, and may include a first terminal area TL_1 in which a plurality of first pad terminals PAD_TL_A (see FIG. 5) is disposed and a second terminal area TL_2 in which a plurality of second pad terminals PAD_TL_B (see FIG. 19) is disposed. In this case, the plurality of first pad terminals PAD_TL_A includes a plurality of first connection pad terminals ROW_PAD_A and first dummy pad terminals DM_TL_A, respectively. The plurality of first connection pad terminals ROW_PAD_A and first dummy pad terminals DM_TL_A may be disposed on different layers. That is, the first connection pad terminals ROW_PAD_A and the first dummy pad terminals DM_TL_A may be disposed on different layers on the substrate SUB.

The display device may further include a display area DA and a pad area PNL_PAD. The display area DA and the pad area PNL_PAD represent areas positioned on the substrate SUB.

The display area DA is an area displaying an image and a display panel 100 (see FIG. 3) emitting light may be disposed in the display area DA. The display panel 100 disposed in the display area DA will be described below.

The pad area PNL_PAD is an area positioned outside (e.g., around) the display area DA. The printed circuit board 300 transferring a signal from a source (e.g., an outside source) may be coupled with the pad area PNL_PAD. The first pad PAD_1 is disposed in the pad area PNL_PAD. The second pad PAD_2 is disposed in (or part of) the printed circuit board 300. The first pad PAD_1 and the second pad PAD_2 may be electrically coupled with each other. In this case, the first pad PAD_1 may include the first terminal area TL_1 and the second terminal area TL_2. The first terminal area TL_1 and the second terminal area TL_2 represent areas positioned on the substrate SUB.

As described above, the plurality of first pad terminals PAD_TL_A (see FIG. 5) may be disposed in the first terminal area TL_1, and the plurality of second pad terminals PAD_TL_B (see FIG. 19) may be disposed in the second terminal area TL_2. The plurality of first pad terminals PAD_TL_A and the plurality of second pad terminals PAD_TL_B may have different shapes. A detailed description of the structures of the first terminal area TL_1 and the second terminal area TL_2 will be described below.

The first terminal area TL_1 and the second terminal area TL_2 configuring the pad area PNL_PAD may be arranged in parallel in a first direction. In this case, the pad area PNL_PAD may be disposed to be spaced apart from the display area DA in a second direction. Hereinafter, for illustrative and descriptive convenience, an X-axis in the drawings represents a first direction and a Y-axis in the drawings represents a second direction.

In some exemplary embodiments, first terminal areas TL_1 may be positioned at sides (e.g., two sides) of the second terminal area TL_2, respectively. However, the arranged structure of the first terminal area(s) TL_1 and the second terminal area TL_2 is not limited thereto or thereby. For instance, the first terminal area TL_1 may be positioned between a pair of second terminal areas TL_2.

A connection wire CL is positioned between the display area DA and the pad area PNL_PAD. The display area DA and the pad area PNL_PAD may be connected by the connection wire CL. The connection wire CL may be connected with a plurality of signal lines disposed in the display area DA. Further, the connection wire CL may be connected with the plurality of first pad terminals PAD_TL_A (see FIG. 5) and the plurality of second pad terminals PAD_TL_B (see FIG. 19) of the pad area PNL_PAD. In this case, the connection wire CL may include a first connection wire CL_A and a second connection wire CL_B. The first connection wire CL_A may connect the display area DA and the first terminal area TL_1 to each other, and the second connection wire CL_B may connect the display area DA and the second terminal area TL_2 to each other.

The printed circuit board 300 is connected to the first pad PAD_1 of the pad area PNL_PAD of the substrate SUB to transfer a signal for driving the display panel 100 to the display panel 100 side. In this case, a driving chip 350 may be mounted on a base film 310 of the printed circuit board 300, and the driving chip 350 may be used for driving the display panel 100. In this case, the second pad PAD_2 is formed at one end of the base film 310 and the second pad PAD_2 may be coupled with the first pad PAD_1 of the substrate SUB. The second pad PAD_2 may be disposed to face the first pad PAD_1.

The second pad PAD_2 may include a third terminal area TL_3 and a fourth terminal area TL_4. The third terminal area TL_3 and the fourth terminal area TL_4 represent areas positioned in (or on) the base film 310.

In the third terminal area TL_3, a plurality of third pad terminals PAD_TL_C (see FIG. 25) may be disposed. In the fourth terminal area TL_4, a plurality of fourth pad terminals (not illustrated) may be disposed. The plurality of third pad terminals PAD_TL_C may have shapes corresponding to the plurality of first pad terminals PAD_TL_A described above. In addition, the plurality of fourth pad terminals may have shapes corresponding to the plurality of second pad terminals PAD_TL_B described above.

According to some exemplary embodiments, the second pad PAD_2 of the printed circuit board 300 may have a shape corresponding to the first pad PAD_1 of the substrate SUB. The plurality of pad terminals disposed in (or as part of) the second pad PAD_2 may be disposed with the same as (or similar patterns to) the plurality of pad terminals disposed in (or as part of) the first pad PAD_1. A detailed description of the structures of the third terminal area TL_3 and the fourth terminal area TL_4 will be described below.

Figure 3:
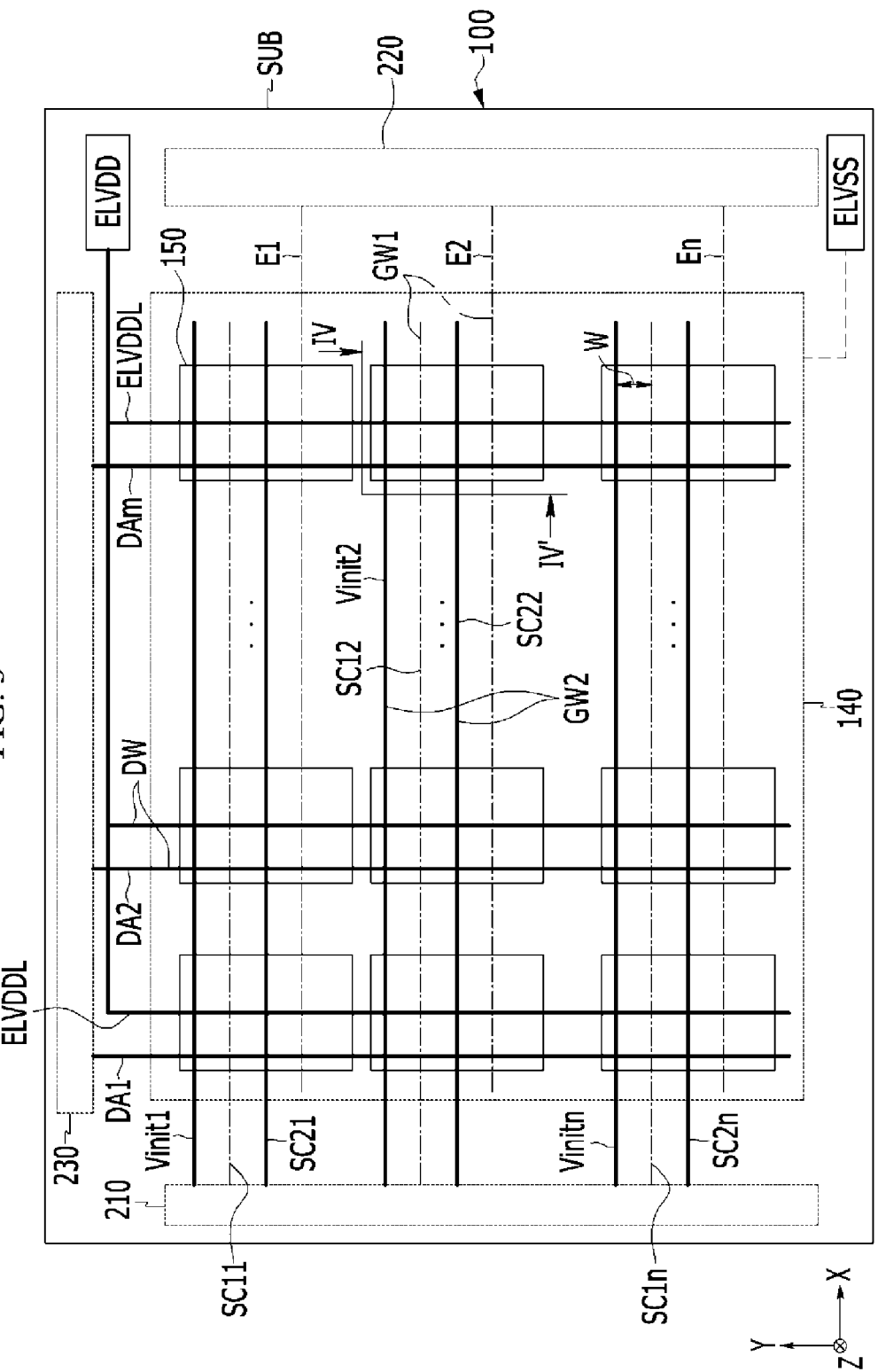
FIG. 3 is a diagram schematically illustrating a display area of the display device of FIG. 1 according to some exemplary embodiments.
Figure 4:
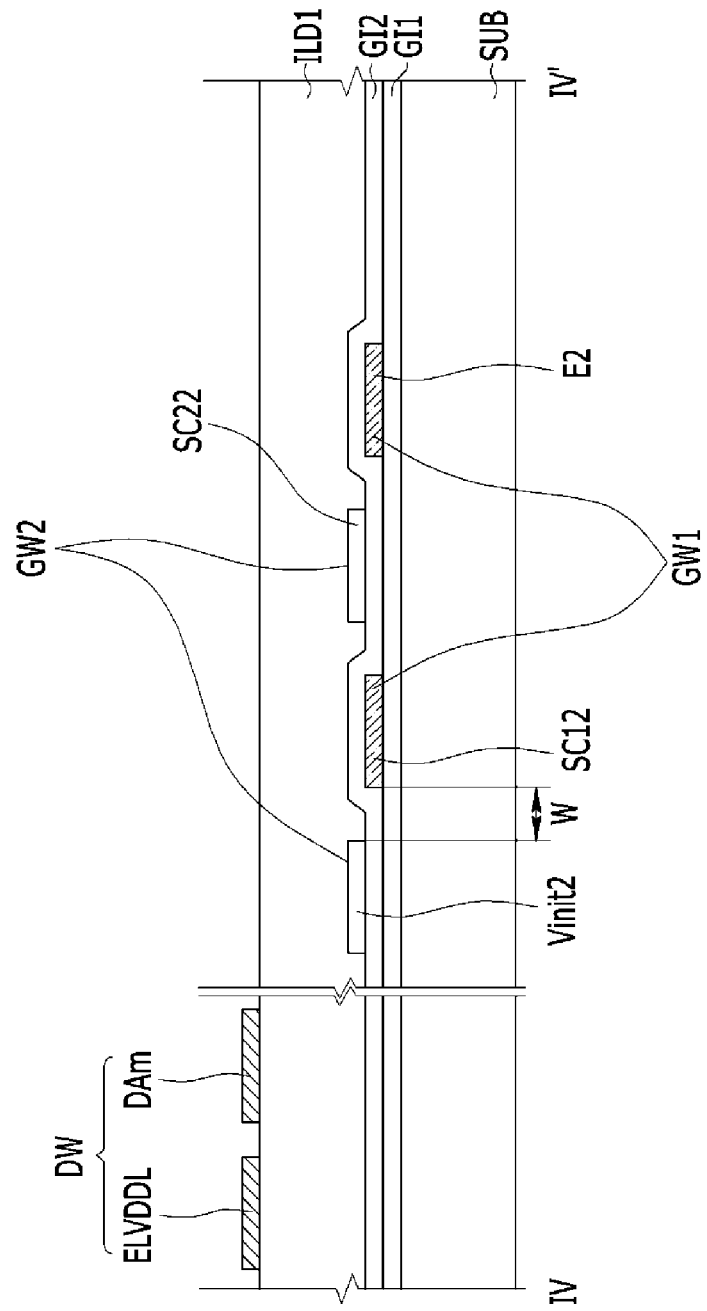
FIG. 4 is a cross-sectional view of the display device of FIG. 1 taken along sectional line IV-IV' of FIG. 3 according to some exemplary embodiments.

Hereinafter, the display panel 100 formed in the display area DA will be described with reference to FIGS. 3 and 4. FIG. 3 is a diagram schematically illustrating a display area of the display device of FIG. 1 according to some exemplary embodiments. FIG. 4 is a cross-sectional view of the display device of FIG. 1 taken along sectional line IV-IV' of FIG. 3 according to some exemplary embodiments. It is noted that the various dashed lines in FIG. 3 are merely utilized to distinguish various illustrated features from one another.

According to some exemplary embodiments, the display panel 100 includes first gate wires GW1, second gate wires GW2, data wires DW, a display unit (or display) 140, and pixels 150. In FIGS. 3 and 4, it is described that the gate wires include the first gate wires GW1 and the second gate wires GW2 positioned on different layers, but exemplary embodiments are not limited thereto or thereby. For instance, the gate wires may be disposed on one layer.

A gate driver 210 sequentially supplies a scan signal to first scan lines SC11-SC1$n$ or second scan lines SC21-SC2$n$ included in the first gate wires GW1 or the second gate wires GW2 in response to a control signal supplied from an source, such as an external control circuit (not illustrated), for example, a timing control unit (or timing controller), and the like. Herein, n is an integer of 1 or more and the same hereinafter.

A pixel 150 is selected by the scan signal to receive data signals in sequence. Herein, the gate driver 210 illustrated in FIG. 3 may be disposed in the driving chip 350 (see FIG. 1) on the printed circuit board 300 (see FIG. 1) and illustrated in FIG. 3 as a separate component for descriptive and illustrative convenience.

The first gate wires GW1 are positioned on the substrate SUB with a first insulating layer GI1 therebetween, and may extend in a first direction. The first gate wires GW1 include first scan lines SC11-SC1n and light emission control lines E1-En.

The first scan lines SC11-SC1n are connected with the gate driver 210 and receive the scan signal from the gate driver 210. The light emission control lines E1-En are connected with a light emission control driver 220 and receive a light emission control signal from the light emission control driver 220. Herein, the light emission control driver 220 illustrated in FIG. 3 may be formed in the driving chip 350 (see FIG. 1) on the printed circuit board 300 (see FIG. 1) like the gate driver 210, but is illustrated in FIG. 3 as a separate component for illustrative and descriptive convenience.

The second gate wires GW2 are positioned on a different layer than the first gate wires GW1 such that a second insulating layer GI2 is disposed therebetween. The first gate wires GW1 and the second gate wires GW2 are not overlapped with each other. The second gate wires GW2 extended in the first direction. The second gate wires GW2 include second scan lines SC21-SC2n and initialization power lines Vinit1-Vinitn.

The second scan lines SC21-SC2n are connected with the gate driver 210 and receive the scan signal from the gate driver 210. The initialization power lines Vinit1-Vinitn are connected with the gate driver 210 and receive initialization power from the gate driver 210. In some exemplary embodiments, the initialization power lines Vinit1-Vinitn receive the initialization power from the gate driver 210, but the initialization power lines Vinit1-Vinitn may be connected with another additional configuration (or structure) to receive the initialization power from the additional another configuration.

The light emission control driver 220 sequentially supplies a light emission control signal to the light emission control lines E1-En in response to the control signal supplied from a source (e.g., an outside source), such as a timing controller. The pixel 150 controls light emission by the light emission control signal. That is, the light emission control signal controls a light emission time of the pixel 150. However, the light emission control driver 220 may also be omitted according to an internal structure of the pixel 150.

A data driver 230 supplies a data signal to data lines DA1-DAm among the data wires DW in response to the control signal supplied from the source (e.g., an outside source), such as a timing controller. The data signal supplied to the data line DA1-DAm is supplied to the pixel 150 selected by the scan signal when the scan signal is supplied to a corresponding first scan line of the first scan lines SC11-SC1n or a second scan line of the second scan lines SC21-SC2n. The pixel 150 charges a voltage corresponding to the data signal and emits light at a luminance corresponding thereto. Herein, the data driver 230 illustrated in FIG. 3 may be formed in the driving chip 350 (see FIG. 1) on the printed circuit board 300 (see FIG. 1) like the gate driver 210, but is illustrated in FIG. 3 as a separate component for illustrative and descriptive convenience.

The data wires DW are positioned on the second gate wires GW2 with a third insulating layer ILD1 therebetween. The data wires DW extend in a second direction crossing the first direction. The data wires DW include data lines DA1-DAm and a driving power line ELVDDL. The data lines DA1-DAm are connected with the data driver 230, and receive the data signal from the data driver 230. The driving power line ELVDDL is connected to external first power ELVDD that is described below, and receives driving power from the first power ELVDD. In this case, the driving power line ELVDDL and the data lines DA1-DAm may be formed on the same layer, e.g. on the third insulating layer ILD1. However, exemplary embodiments are not limited thereto or thereby. For instance, the driving power line ELVDDL and the data lines DA1-DAm may be formed on different layers.

For example, the driving power line ELVDDL may be formed on the same layer as the first gate wires GW1, and the data lines DA1-DAm may be formed on the same layer as the second gate wires GW2. On the other hand, the driving power line ELVDDL may be formed on the same layer as the second gate wires GW2, and the data lines DA1-DAm may be formed on the same layer as the first gate wires GW1.

The display unit 140 includes first gate wires GW1, second gate wires GW2, data wires DW, and a plurality of pixels 150 positioned in cross regions of the data wires DW. Each pixel 150 may include an organic light emitting element (not shown) that emits light at a luminance corresponding to the driving current corresponding to the data signal and a pixel circuit (not illustrated) for controlling the driving current flowing in the organic light emitting element. The pixel circuit is connected with the first gate wires GW1, the second gate wires GW2, and the data wires DW, respectively. The organic light emitting element is also connected to the pixel circuit. Although the pixel 150 is described as an organic light emitting element, it is contemplated that the pixel 150 is not limited thereto or thereby. For instance, the pixel 150 may be a liquid crystal display element, an electrophoretic display element, and/or the like.

The organic light emitting element of display unit 140 is connected with the external first power ELVDD with the pixel circuit therebetween, and is also connected with a second power ELVSS. The first power ELVDD and the second power ELVSS supply driving power and common power to the pixel 150 of the display unit 140, respectively. The pixel 150 emits light at a luminance corresponding to the driving current through the organic light emitting element from the first power ELVDD in response to the data signal according to the driving power and the common power supplied to the pixel 150.

According to some exemplary embodiments, all of the first gate wires GW1 and the second gate wires GW2, which are the gate wires that cross the pixel 150 in the first direction and are not overlapped with each other, are not positioned on the same layer. Instead, the first gate wires GW1 and the second gate wires GW2 are positioned on different layers with the second insulating layer GI2 therebetween, respectively. Since a distance W between the gate wires that are positioned on different layers and adjacent to each other may be narrowly formed, more pixels 150 may be formed in the same area. In this manner, a relatively high-resolution display device may be formed.

Hereinafter, a structure of the first pad terminal PAD_TL_A disposed in the first terminal area TL_1 will be described in detail with reference to FIGS. 5 to 13.

Figure 5:
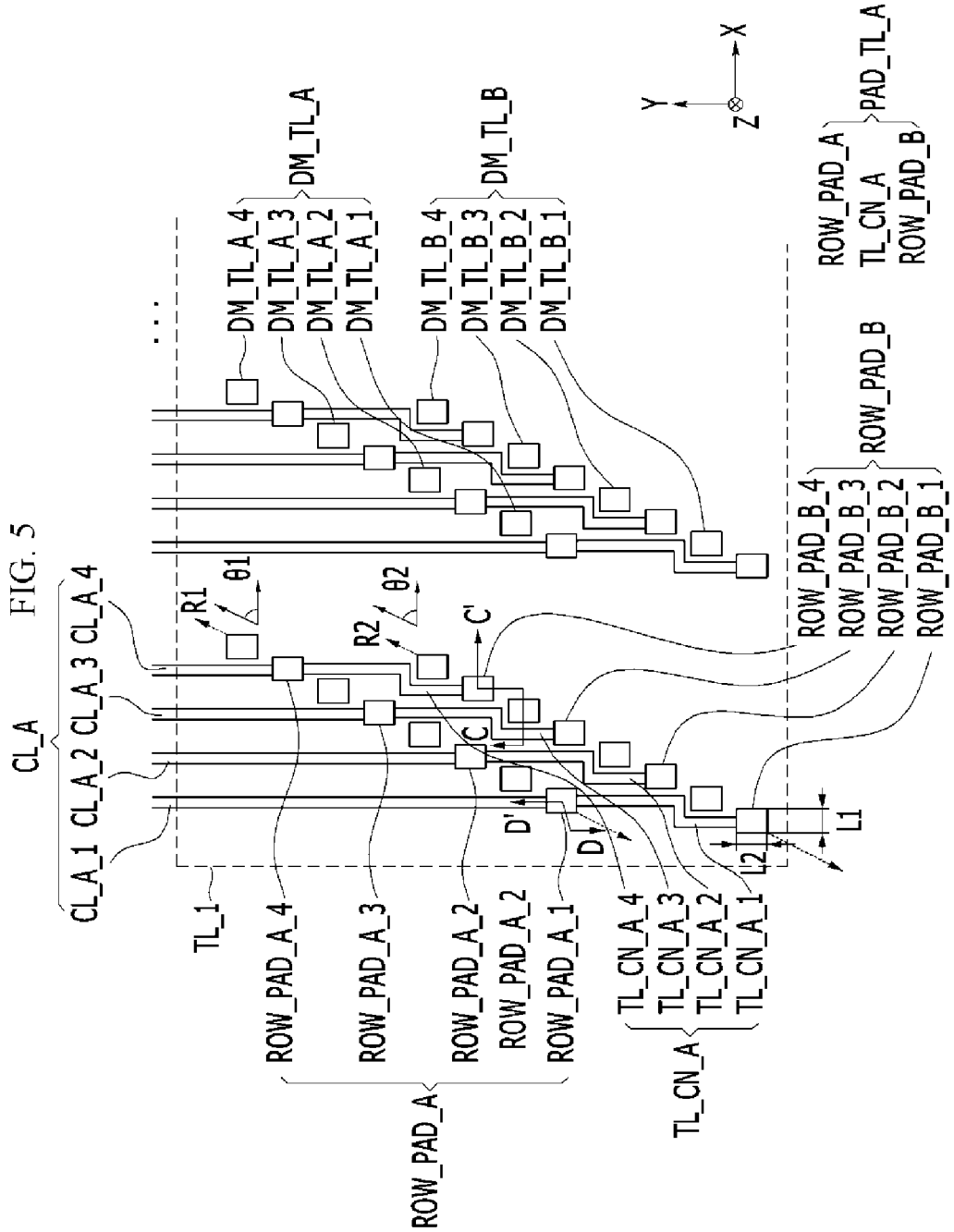
FIG. 5 is an enlarged diagram of a first terminal area of the display device of FIG. 1 according to some exemplary embodiments.
Figure 6:
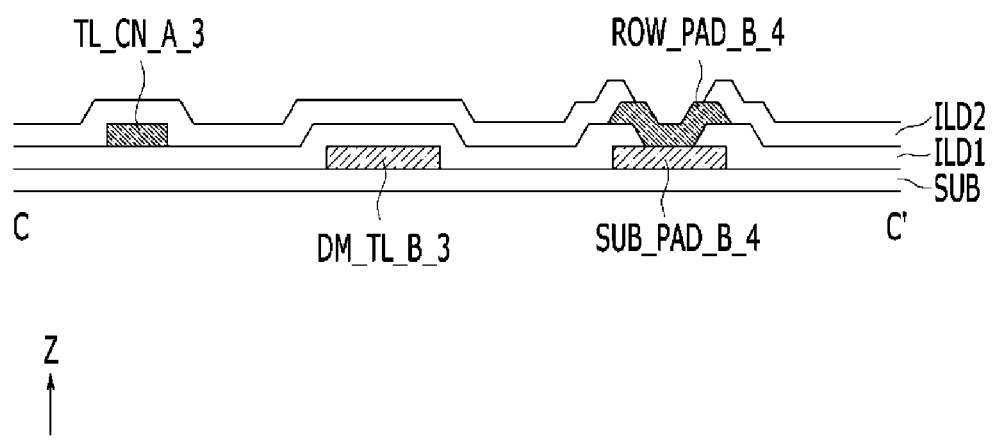
FIG. 6 is a cross-sectional view of the display device of FIG. 1 taken along sectional line C-C' of FIG. 5 according to some exemplary embodiments.
Figure 7:
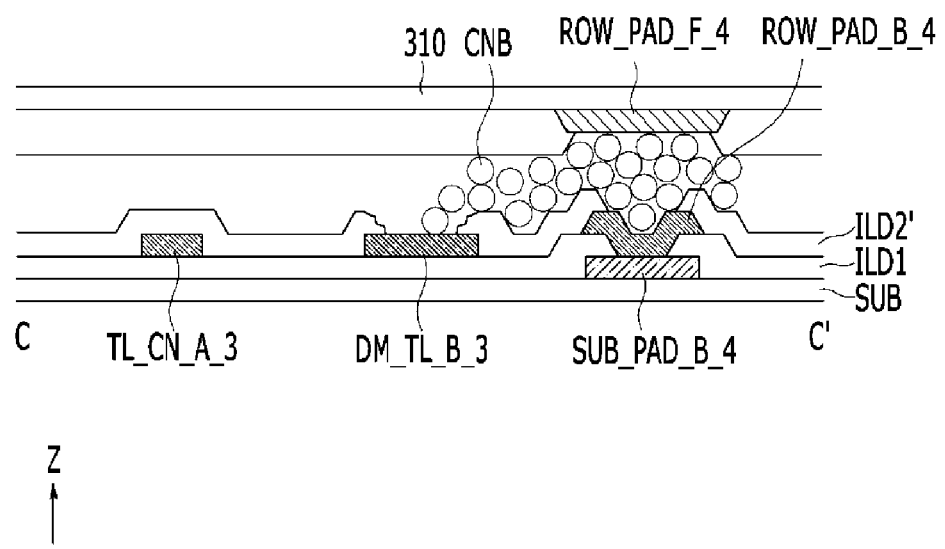
FIG. 7 is a cross-sectional view of a Comparative Example in which a second connection pad terminal and a second dummy pad terminal are disposed on the same layer as one another according to some exemplary embodiments.
Figure 8:
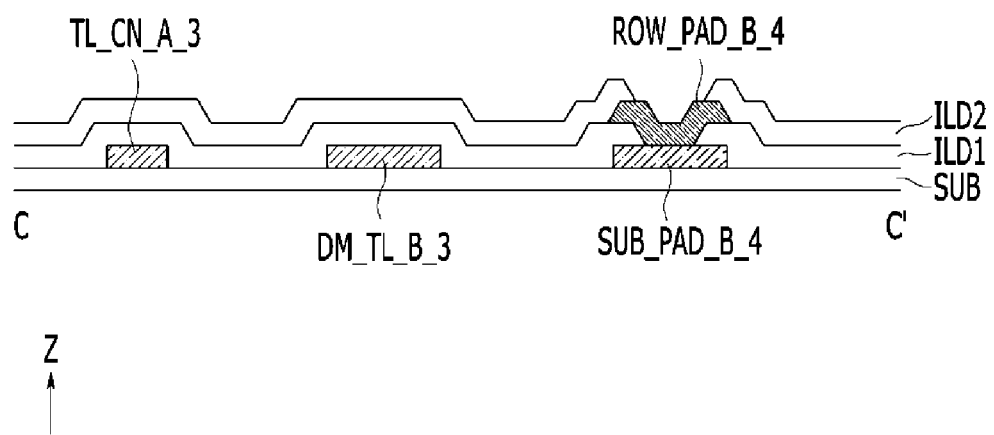
FIG. 8 is a cross-sectional view illustrating a first modified example of a first terminal connection line of the display device of FIG. 6 according to some exemplary embodiments.
Figure 9:
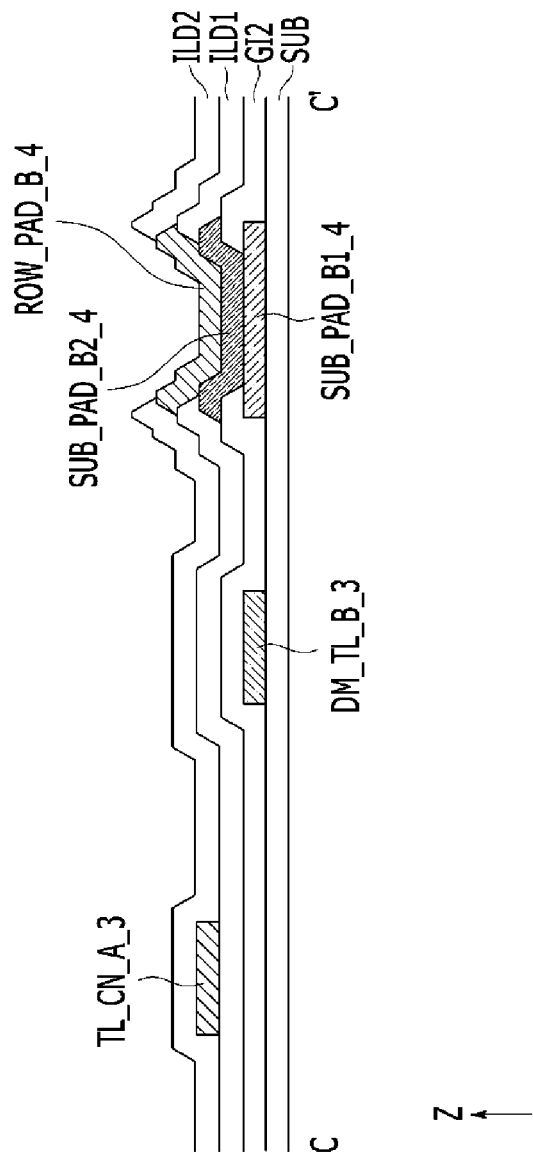
FIG. 9 is a cross-sectional view illustrating a second modified example of a first terminal connection line of the display device of FIG. 6 according to some exemplary embodiments.
Figure 10:
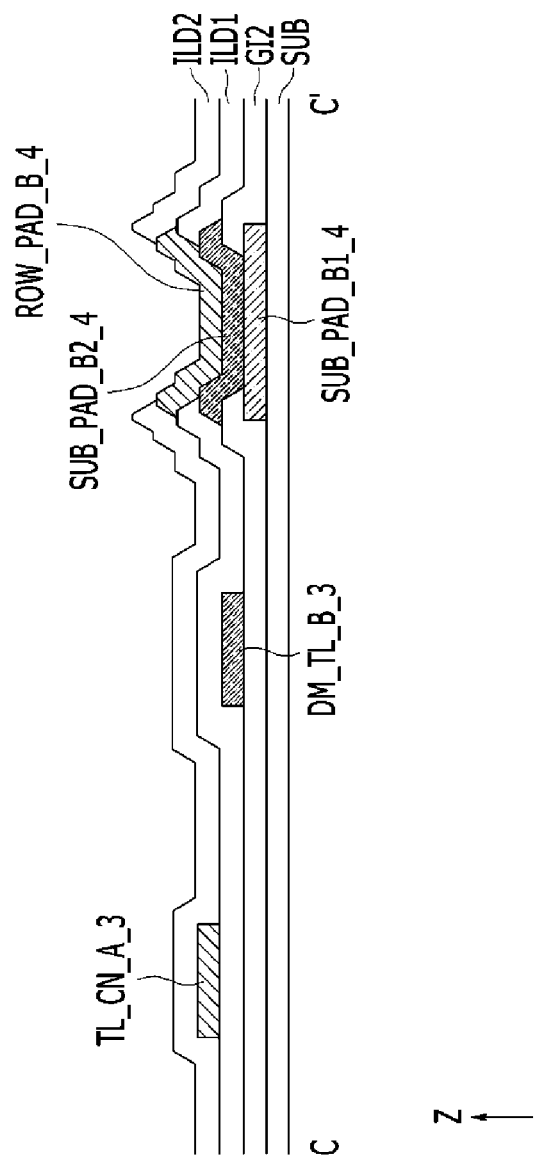
FIG. 10 is a cross-sectional view illustrating a third modified example of a first terminal connection line of the display device of FIG. 6 according to some exemplary embodiments.
Figure 11:
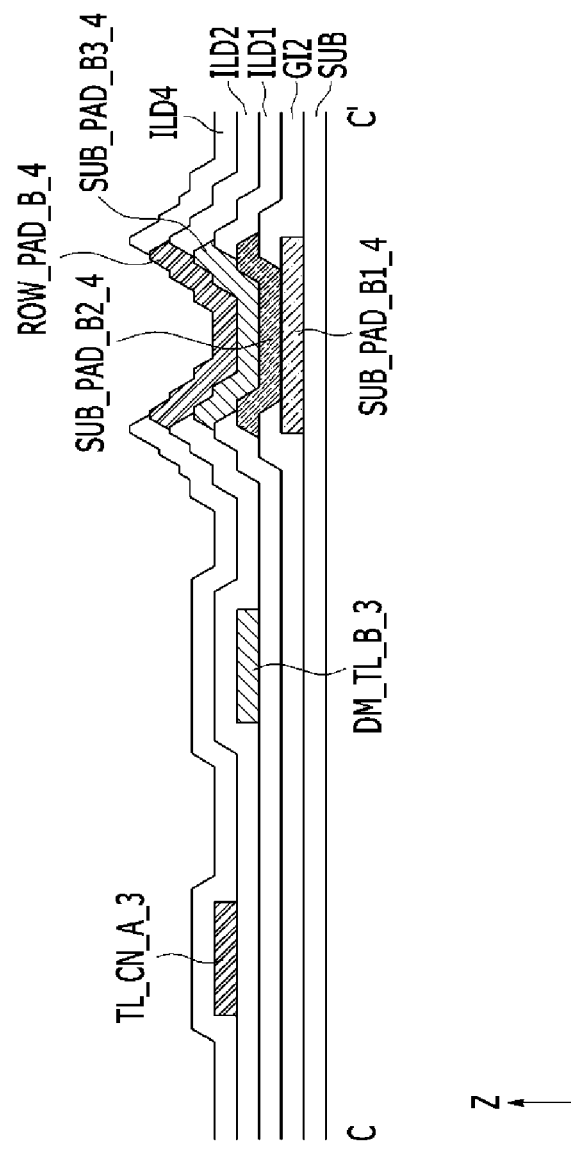
FIG. 11 is a cross-sectional view illustrating a fourth modified example of a first terminal connection line of the display device of FIG. 6 according to some exemplary embodiments.
Figure 12:
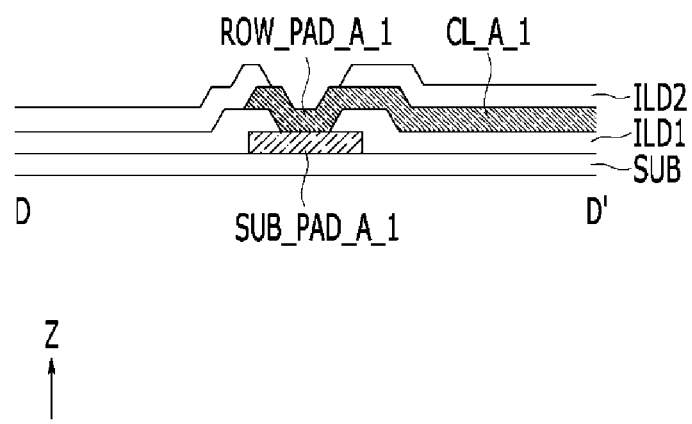
FIG. 12 is a cross-sectional view of the display device of FIG. 1 taken along sectional line D-D' of FIG. 5 according to some exemplary embodiments.
Figure 13:
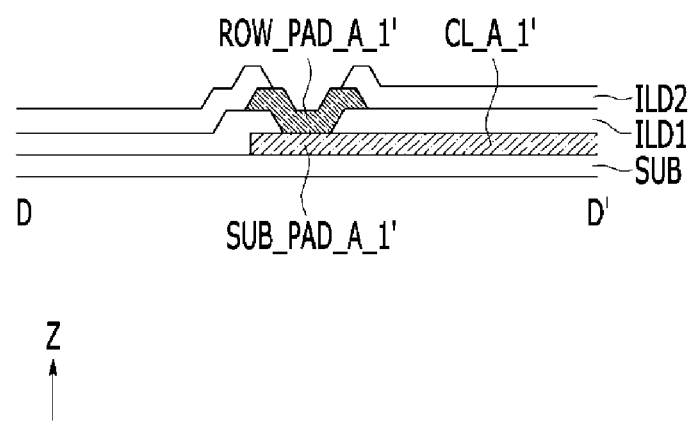
FIG. 13 is a cross-sectional view illustrating a modified example of a first connection wire of the display device of FIG. 12 according to some exemplary embodiments.

FIG. 5 is an enlarged diagram of a first terminal area of the display device of FIG. 1 according to some exemplary embodiments. FIG. 6 is a cross-sectional view of the display device of FIG. 1 taken along sectional line C-C' of FIG. 5 according to some exemplary embodiments. FIG. 7 is a cross-sectional view of a Comparative Example in which a second connection pad terminal and a second dummy pad terminal are disposed on the same layer as one another according to some exemplary embodiments. FIG. 8 is a cross-sectional view illustrating a first modified example of a first terminal connection line of the display device of FIG. 6 according to some exemplary embodiments. FIG. 9 is a cross-sectional view illustrating a second modified example of a first terminal connection line of the display device of FIG. 6 according to some exemplary embodiments. FIG. 10 is a cross-sectional view illustrating a third modified example of a first terminal connection line of the display device of FIG. 6 according to some exemplary embodiments. FIG. 11 is a cross-sectional view illustrating a fourth modified example of a first terminal connection line of the display device of FIG. 6 according to some exemplary embodiments. FIG. 12 is a cross-sectional view of the display device of FIG. 1 taken along sectional line D-D' of FIG. 5 according to some exemplary embodiments. FIG. 13 is a cross-sectional view illustrating a modified example of a first connection wire of the display device of FIG. 12 according to some exemplary embodiments.

Referring to FIGS. 5 and 6, in the first terminal area TL_1, a plurality of first pad terminals PAD_TL_A may be disposed. In this case, the first terminal area TL_1 may be connected with power lines of the display area DA (see FIG. 1), for example, the driving power line ELVDDL (see FIG. 3), the common power line (see FIG. 3), the initialization power lines Vinit1-Vinitn (see FIG. 3), the first scan lines SC11-SC1n (see FIG. 3), the second scan lines SC21-SC2n (see FIG. 3), and the like, through the first connection wire CL_A. The plurality of first pad terminals PAD_TL_A may be spaced apart from each other at determined intervals in the first direction in the first terminal area TL_1, respectively.

In some exemplary embodiments, the plurality of first pad terminals PAD_TL_A may include a plurality of first connection pad terminals ROW_PAD_A, a plurality of second connection pad terminals ROW_PAD_B, and a plurality of first terminal connection lines TL_CN_A, respectively.

The first connection pad terminals ROW_PAD_A may be spaced apart from each other in one direction. In this case, the first connection pad terminals ROW_PAD_A may be arranged along a first column R1 that forms a first slope angle θ1 with the first direction. The first slope angle θ1 may be greater than 0° and less than 90°. Each of the first connection pad terminals ROW_PAD_A disposed in the first terminal area TL_1 may be arranged to be inclined in the same direction. That is, the first connection pad terminals ROW_PAD_A may be arranged to be inclined at the same angle based on the first direction in the first terminal area TL_1. For example, as illustrated in FIG. 5, the first connection pad terminals ROW_PAD_A may be arranged to be inclined in an approximately 1 o'clock direction based on the second direction.

In some exemplary embodiments, the first terminal areas TL_1 may be disposed at the left side and the right side of the second terminal area TL_2, and the first connection pad terminals ROW_PAD_A of the first terminal areas TL_1 that are disposed at the left side and the right side may be arranged to be inclined at the same angle.

Intervals among adjacent first connection pad terminals ROW_PAD_A may be the same as each other. For example, an interval between a first, first connection pad terminal ROW_PAD_A_1 and a second, first connection pad terminal ROW_PAD_A_2, an interval between the second, first connection pad terminal ROW_PAD_A_2 and a third, first connection pad terminal ROW_PAD_A_3, and an interval between the third, first connection pad terminal ROW_PAD_A_3 and a fourth, first connection pad terminal ROW_PAD_A_4 may be the same as each other. Herein, the intervals among the first connection pad terminals ROW_PAD_A represent distances that are spaced apart from each other along the first column R1.

The first connection pad terminals ROW_PAD_A are electrically in contact with fifth connection pad terminals ROW_PAD_E (see FIG. 25) of the printed circuit board 300. It is also noted that each of the first connection pad terminals ROW_PAD_A may have a substantially quadrangular shape.

The second connection pad terminals ROW_PAD_B may be spaced apart from the first connection pad terminals ROW_PAD_A in the second direction. Like the first connection pad terminals ROW_PAD_A, the second connection pad terminals ROW_PAD_B may be spaced apart from each other in one direction. In this case, the second connection pad terminals ROW_PAD_B may be arranged along a second column R2 that forms a second slope angle θ2 with the first direction. The second slope angle θ2 may be greater than 0° and less than 90°. Each of the second connection pad terminals ROW_PAD_B disposed in the first terminal area TL_1 may be arranged to be inclined in the same direction like the first connection pad terminals ROW_PAD_A. That is, the second connection pad terminals ROW_PAD_B may be arranged to be inclined at the same angle based on the first direction in the first terminal area TL_1. For example, as illustrated in FIG. 5, the second connection pad terminals ROW_PAD_B may be arranged to be inclined in an approximately 1 o'clock direction based on the second direction. Like the first connection pad terminals ROW_PAD_A, each of the second connection pad terminals ROW_PAD_B of the first terminal areas TL_1 that are disposed at the left side and the right side of the second terminal area TL_2 may be arranged to be inclined at the same angle.

In some exemplary embodiments, the first slope angle θ1 and the second slope angle θ2 may be the same as each other. Accordingly, the first connection pad terminals ROW_PAD_A and the second connection pad terminals ROW_PAD_B may be arranged to be inclined at the same angle with respect to the first direction. However, exemplary embodiments are not limited thereto or thereby. For instance, the first slope angle θ1 and the second slope angle θ2 may be different from each other. In an exemplary embodiment, at least some of the first connection pad terminals ROW_PAD_A and at least some of the second connection pad terminals ROW_PAD_B may be arranged to be inclined at different angles with respect to the first direction.

Figure 23:
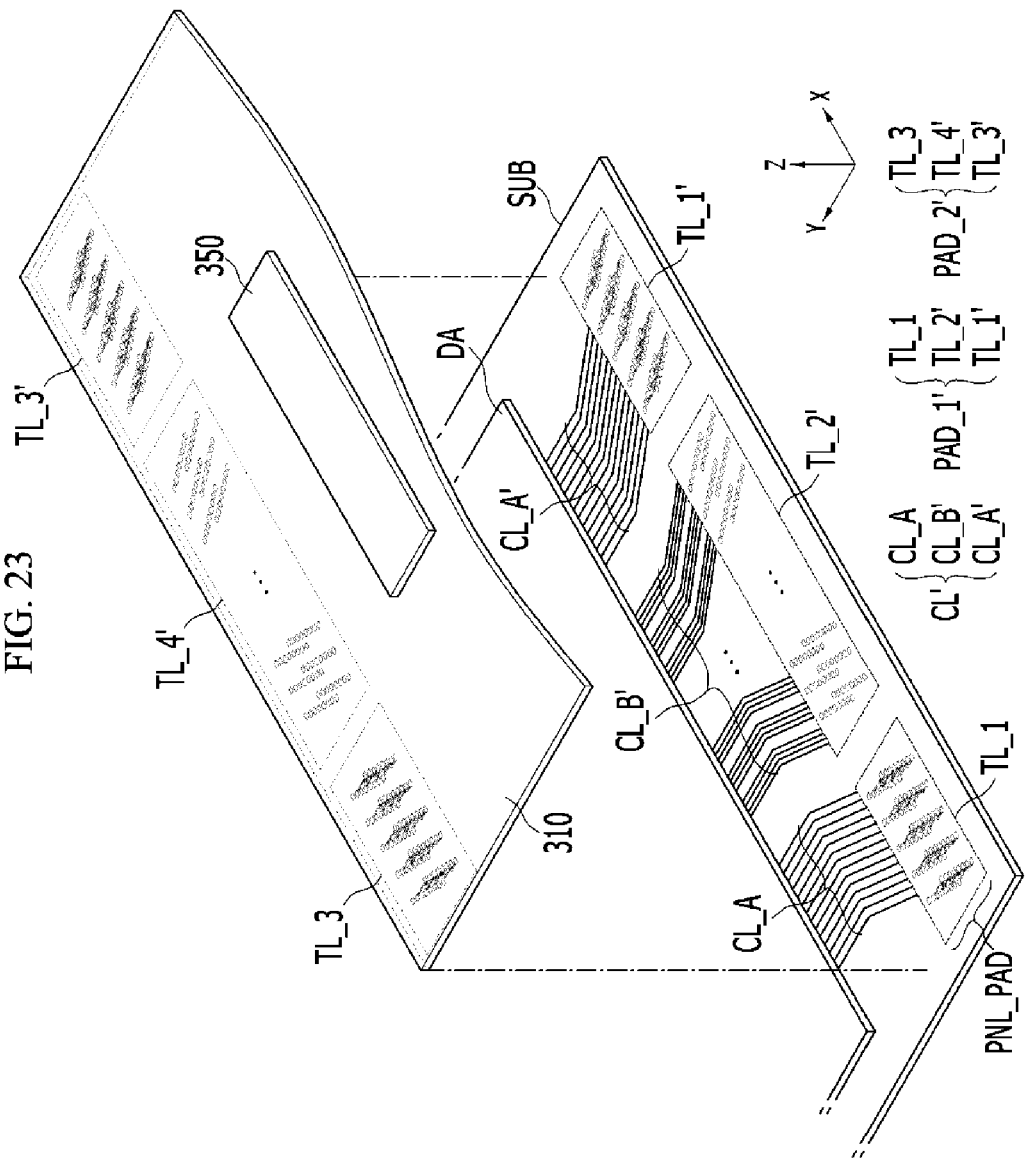
FIG. 23 is a diagram illustrating a modified example of first and second terminal areas of the display device of FIG. 1 according to some exemplary embodiments.

For example, as illustrated in FIG. 23, a plurality of first pad terminals disposed in the first terminal areas TL_1 and TL_1' at two sides of the second terminal area TL_2' may be arranged to be mirror images of each other about the second terminal area TL_2'. For example, a plurality of first pad terminals PAD_TL_A disposed in the first terminal area TL_1 at the left side based on the second terminal area TL_2' may be disposed to be inclined in an approximately 1 o'clock direction, and a plurality of first pad terminals PAD_TL_A disposed in the first terminal area TL_1' at the right side based on the second terminal area TL_2' may be disposed to be inclined in an approximately 11 o'clock direction.

Intervals among adjacent second connection pad terminals ROW_PAD_B may be the same as each other. For example, an interval between a first, second connection pad terminal ROW_PAD_B_1 and a second, second connection pad terminal ROW_PAD_B_2, an interval between the second, second connection pad terminal ROW_PAD_B_2 and a third, second connection pad terminal ROW_PAD_B_3, and an interval between the third, second connection pad terminal ROW_PAD_B_3 and a fourth, second connection pad terminal ROW_PAD_B_4 may be the same as each other. Herein, the intervals among the second connection pad terminals ROW_PAD_B represent distances that are spaced apart from each other along the second column R2.

The second connection pad terminals ROW_PAD_B are electrically in contact with sixth connection pad terminals ROW_PAD_F (see FIG. 25) of the printed circuit board 300. Each of the second connection pad terminals ROW_PAD_B may have a substantially quadrangular shape.

In some exemplary embodiments, the quadrangle (which is the shape of each of the first connection pad terminals ROW_PAD_A and the second connection pad terminals ROW_PAD_B) may include first sides L1 parallel with the first direction (e.g., X-axis direction) and second sides L2 parallel with the second direction (e.g., Y-axis direction). Herein, the first side L1 and the second side L2 may be adjacent to each other. In this case, in the quadrangle, each of the second sides L2 may be formed longer than each of the first sides L1 (L1 <L2). That is, the quadrangle may be a rectangular shape elongated in the second direction.

According to some exemplary embodiments, when each of the first connection pad terminals ROW_PAD_A and each of the second connection pad terminals ROW_PAD_B has a rectangular shape elongated in the second direction, an interval in the first direction between the first connection pad terminals ROW_PAD_A or the second connection pad terminals ROW_PAD_B may be reduced. As a result, the number of first connection pad terminals ROW_PAD_A and second connection pad terminals ROW_PAD_B disposed in the first terminal area TL_1 may be increased.

The plurality of first connection pad terminals ROW_PAD_A and the plurality of second connection pad terminals ROW_PAD_B may be connected to each other by the plurality of first terminal connection lines TL_CN_A. For instance, each of the plurality of first terminal connection lines TL_CN_A may connect one of the plurality of first connection pad terminals ROW_PAD_A and one of the plurality of second connection pad terminals ROW_PAD_B to each other.

For example, the first, first connection pad terminal ROW_ PAD_A_1 and the first, second connection pad terminal ROW_PAD_B_1 may be connected to each other by a first, first terminal connection line TL_CN_A_1, and the second, first connection pad terminal ROW_PAD_A_2 and the second, second connection pad terminal ROW-_PAD_B_2 may be connected to each other by a second, first terminal connection line TL_CN_A_2. In addition, the third, first connection pad terminal ROW_PAD_A_3 and the third, second connection pad terminal ROW_PAD_B_3 may be connected to each other by the third, first terminal connection line TL_CN_A_3, and the fourth, first connection pad terminal ROW_PAD_A_4 and the fourth, second connection pad terminal ROW_PAD_B_4 may be connected to each other by the fourth, first terminal connection line TL_CN_A_4.

According to some exemplary embodiments, each of the plurality of first terminal connection lines TL_CN_A may have at least one bent shape. For example, as illustrated in FIG. 5, the first, first terminal connection line TL_CN_A_1 is extended in the second direction from the first, second connection pad terminal ROW_PAD_B_1 to the first, first connection pad terminal ROW_PAD_A_1. In this case, the first, first terminal connection line TL_CN_A_1 may be disposed to be bent in the first direction and then bent in the second direction. That is, the first, first terminal connection line TL_CN_A_1 may be disposed to have a twice-bent shape.

The plurality of first connection pad terminals ROW_PAD_A may be connected with the first connection wires CL_A. For example, the first, first connection pad terminal ROW_PAD_A_1 may be connected with a first, first connection wire CL_A_1, and the second, first connection pad terminal ROW_PAD_A_2 may be connected with a second, first connection wire CL_A_2. The third, first connection pad terminal ROW_PAD_A_3 may be connected with a third, first connection wire CL_A_3, and the fourth, first connection pad terminal ROW_PAD_A_4 may be connected with a fourth, first connection wire CL_A_4.

Referring to FIG. 12, the first, first connection pad terminal ROW_PAD_A_1 may be disposed on the same layer as the first, first connection wire CL_A_1, and the first, first connection pad terminal ROW_PAD_A_1 may be disposed on a first, first sub pad wire SUB_PAD_A_1. That is, the first, first connection pad terminal ROW_PAD_A_1 and the first, first connection wire CL_A_1 may be integrally formed and be disposed on the first, first sub pad wire SUB_PAD_A_1. However, exemplary embodiments are not limited thereto or thereby. For instance, as illustrated in FIG. 13, the first, first connection pad terminal ROW_PAD_A_1' may be disposed on a different layer from the first, first connection wire CL_A_1'. In this case, the first, first connection wire CL_A_1' is positioned below the first, first connection pad terminal ROW_PAD_A_1', and the first, first connection wire CL_A_1' may be integrally formed with the first, first sub pad wire SUB_PAD_A_1' positioned below the first, first connection pad terminal ROW_PAD_A_1'.

Referring back to FIG. 5, in some exemplary embodiments, at least one first dummy pad terminal DM_TL_A may be disposed between a pair of adjacent first connection pad terminals ROW_PAD_A among the plurality of first connection pad terminals ROW_PAD_A.

For example, a first, first dummy pad terminal DM_TL_A_1 may be disposed between the first, first connection pad terminal ROW_PAD_A_1 and the second, first connection pad terminal ROW_PAD_A_2, and a second, first dummy pad terminal DM_TL_A_2 may be disposed between the second, first connection pad terminal ROW_PAD_A_2 and the third, first connection pad terminal ROW_ PAD_A_3. A third, first dummy pad terminal DM_TL_A_3 may be disposed between the third, first connection pad terminal ROW_PAD_A_3 and the fourth, first connection pad terminal ROW_PAD_A_4, and a fourth, first dummy pad terminal DM_TL_A_4 may be disposed adjacent to the fourth, first connection pad terminal ROW_PAD_A_4.

In FIG. 5, it is illustrated that one first dummy pad terminal DM_TL_A is disposed between a pair of adjacent first connection pad terminals ROW_PAD_A. However, exemplary embodiments are not limited thereto or thereby. For instance, two or more first dummy pad terminals DM_TL_A may be disposed between adjacent first connection pad terminals ROW_PAD_A. In this case, the plurality of first connection pad terminals ROW_PAD_A and the first dummy pad terminals DM_TL_A may be arranged in parallel. That is, the first connection pad terminals ROW_PAD_A and the first dummy pad terminals DM_TL_A may be arranged in serial along the first column R1 and may be disposed to be inclined at the first slope angle $\theta1$ with respect to the first direction.

In some exemplary embodiments, the first dummy pad terminals DM_TL_A are not electrically connected with the plurality of adjacent first connection pad terminals ROW_PAD_A or a plurality of first terminal connection lines TN_CN_A.

According to some exemplary embodiments, at least one first dummy pad terminal DM_TL_A is disposed between a pair of adjacent first connection pad terminals ROW_PAD_A to increase a distance between the adjacent first connection pad terminals ROW_PAD_A. This configuration prevents (or reduces) capacitive coupling, that is, coupling generated between the first connection pad terminals ROW_PAD_A.

Further, at least one second dummy pad terminal DM_TL_B may be disposed between a pair of adjacent second connection pad terminals ROW_PAD_B among the plurality of second connection pad terminals ROW_PAD_B. For example, a first, second dummy pad terminal DM_TL_B_1 may be disposed between the first, second connection pad terminal ROW_PAD_B_1 and the second, second connection pad terminal ROW_PAD_B_2, and a second, second dummy pad terminal DM_TL_B_2 may be disposed between the second, second connection pad terminal ROW_PAD_B_2 and the third, second connection pad terminal ROW_PAD_B_3. A third, second dummy pad terminal DM_TL_B_3 may be disposed between the third, second connection pad terminal ROW_PAD_B_3 and the fourth, second connection pad terminal ROW_PAD_B_4, and a fourth, second dummy pad terminal DM_TL_B_4 may be disposed adjacent to the fourth, second connection pad terminal ROW_PAD_B_4.

In FIG. 5, it is illustrated that one second dummy pad terminal DM_TL_B is disposed between a pair of adjacent second connection pad terminals ROW_PAD_B. However, exemplary embodiments are not limited thereto or thereby. For instance, two or more second dummy pad terminals DM_TL_B may be disposed between adjacent second connection pad terminals ROW_PAD_B.

The second connection pad terminals ROW_PAD_B and the second dummy pad terminals DM_TL_B may be arranged in parallel. That is, the second connection pad terminals ROW_PAD_B and the second dummy pad terminals DM_TL_B may be arranged in serial along the second column R2 and may be disposed to be inclined at the second slope angle θ2 with respect to the first direction.

In some exemplary embodiments, the first connection pad terminals ROW_PAD_A and the second connection pad terminals ROW_PAD_B are disposed to be inclined at a determined angle in the first direction, and, as such, an increased amount of pad terminals may be disposed in a determined area.

With continued reference to FIGS. 5 and 6, the plurality of first connection pad terminals ROW_PAD_A and the first dummy pad terminals DM_TL_A may be disposed on different layers. In addition, the plurality of second connection pad terminals ROW_PAD_B and the second dummy pad terminals DM_TL_B may be disposed on different layers. However, FIG. 6 illustrates that the plurality of second connection pad terminals ROW_PAD_B and the second dummy pad terminals DM_TL_B are different from each other. It is noted, however, that the plurality of first connection pad terminals ROW_PAD_A and the first dummy pad terminals DM_TL_A may also have the same laminated structure as the plurality of second connection pad terminals ROW_PAD_B and the second dummy pad terminals DM_TL_B.

As seen in FIG. 6, the fourth, second connection pad terminal ROW_PAD_B_4 and the third, second dummy pad terminal DM_TL_B_3 may be disposed on different layers on the substrate SUB. A third insulating layer ILD1 may be disposed between the fourth, second connection pad terminal ROW_PAD_B_4 and the third, second dummy pad terminal DM_TL_B_3. Based on the third insulating layer ILD1, the third, second dummy pad terminal DM_TL_B_3 may be disposed below the third insulating layer ILD1 and the fourth, second connection pad terminal ROW_PAD_B_4 may be disposed on the third insulating layer ILD1.

Further, on the third insulating layer ILD1, the fourth, second connection pad terminal ROW_PAD_B_4 and the third, first terminal connection line TL_CN_A_3 may be disposed. That is, the fourth, second connection pad terminal ROW_PAD_B_4 and the third, first terminal connection line TL_CN_A_3 may be positioned on the same layer. However, exemplary embodiments are not limited thereto or thereby. For instance, as illustrated in FIG. 8, the third, first terminal connection line TL_CN_A_3 may be disposed on the same layer as the third, second dummy pad terminal DM_TL_B_3.

Adverting back to FIG. 6, in the third insulating layer ILD1, a through-hole exposing a part of the fourth, second sub pad wire SUB_PAD_B_4 positioned below the third insulating layer ILD1 may be formed. The fourth, second connection pad terminal ROW_PAD_B_4 may be in contact with the fourth, second sub pad wire SUB_PAD_B_4 through the through-hole.

On the third insulating layer ILD1, a fourth insulating layer ILD2 that covers the fourth, second connection pad terminal ROW_PAD_B_4 and the third, first terminal connection line TN_CN_A_3 may be positioned. A through-hole exposing a part of the fourth, second connection pad terminal ROW_PAD_B_4 may be formed in the fourth insulating layer ILD2. In this case, the fourth, second connection pad terminal ROW_PAD_B_4 may be electrically connected with a fourth, sixth connection pad terminal ROW_PAD_F_4 of the printed circuit board 300 through a conductive ball CNB (see generally FIG. 29).

Referring to FIG. 7, there is illustrated a cross-sectional view of a Comparative Example in which the fourth, second connection pad terminal ROW_PAD_B_4 and a third, second dummy pad terminal DM_TL_B_3 are disposed on the same layer, and when the fourth, second connection pad terminal ROW_PAD_B_4 and the third, second dummy pad terminal DM_TL_B_3 are disposed on the same layer, the fourth, second connection pad terminal ROW_PAD_B_4 and the third, second dummy pad terminal DM_TL_B_3 may be short-circuited, as will become more apparent below.

With continued reference to FIG. 7, when the fourth, second connection pad terminal ROW_PAD_B_4 and the third, second dummy pad terminal DM_TL_B_3 are disposed on the same layer, a fourth insulating layer ILD2' may be disposed on the third, second dummy pad terminal DM_TL_B_3. In a manufacturing process of a corresponding display device, cracks may be generated in the fourth insulating layer ILD2' covering the third, second dummy pad terminal DM_TL_B_3, and, as such, a part of the fourth insulating layer ILD2' may be detached. In this case, a part of the third, second dummy pad terminal DM_TL_B_3 disposed below the cracked fourth insulating layer ILD2' may be exposed.

A part of the conductive ball CNB electrically connecting the fourth, second connection pad terminal ROW_PAD_B_4 and a fourth, sixth connection pad terminal ROW_PAD_F_4 may be in contact with the exposed third, second dummy pad terminal DM_TL_B_3. As a result, the third, second dummy pad terminal DM_TL_B_3 and the fourth, second connection pad terminal ROW_PAD_B_4 are electrically connected to each other, and the third, second dummy pad terminal DM_TL_B_3 and the fourth, second connection pad terminal ROW_PAD_B_4 may be short-circuited with each other.

In some cases, cracks are generated in the fourth insulating layer ILD2' covering the third, first terminal connection line TL_CN_A_3 and a part of the fourth insulating layer ILD2' is detached, and, as such, a part of the third, first terminal connection line TL_CN_A_3 may be exposed. In this case, the third, first terminal connection line TL_CN_A_3 may be short-circuited with the third, second dummy pad terminal DM_TL_B_3 and/or the fourth, second connection pad terminal ROW_PAD_B_4.

As such, as illustrated in FIG. 7, when the fourth, second connection pad terminal ROW_PAD_B_4 and the third, second dummy pad terminal DM_TL_B_3 are disposed on the same layer, the fourth, second connection pad terminal ROW_PAD_B_4 and the third, second dummy pad terminal DM_TL_B_3 may be short-circuited with each other. However, as in some exemplary embodiments (like illustrated in FIG. 6), when the third, second dummy pad terminal DM_TL_B_3 is disposed on a different layer from the fourth, second connection pad terminal ROW_PAD_B_4, the fourth, second connection pad terminal ROW_PAD_B_4 and the third, second dummy pad terminal DM_TL_B_3 may be prevented from being short-circuited with each other.

In some exemplary embodiments, the third, second dummy pad terminal DM_TL_B_3 may be disposed on the same layer as at least one of the first gate wires GW1 and the second gate wires GW2 disposed in the display area DA. For example, as illustrated in FIGS. 9 and 10, a third, second dummy pad terminal DM_TL_B_3 may be disposed on the same layer as any one of the first gate wires GW1 (see FIG. 3) and the second gate wires GW2 (see FIG. 3).

Referring to FIG. 9, the third, second dummy pad terminal DM_TL_B_3 may be disposed on the same layer as the first gate wires GW1 (see FIG. 4). Referring to FIG. 10, the third, second dummy pad terminal DM_TL_B_3 may be disposed on the same layer as the second gate wires GW2 (see FIG. 4).

In some exemplary embodiments, a fourth, second connection pad terminal ROW_PAD_B_4 may be disposed on the same layer as the data lines DA1-DAm disposed in the display area DA. For example, the fourth, second connection pad terminal ROW_PAD_B_4 may be disposed on the same layer as the data wires DW (see FIG. 3). Meanwhile, referring to FIG. 11, the fourth, second connection pad terminal ROW_PAD_B_4 and the third, second dummy pad terminal DM_TL_B_3 may be formed in a same layer as the data wires DW (see FIG. 4), but, in some exemplary embodiments, the fourth, second connection pad terminal ROW_PAD_B_4 and the third, second dummy pad terminal DM_TL_B_3 may be formed in a same layer as only some of the data wires DW. For instance, in FIG. 4, the data wires DW are illustrated as in a single layer, but the data wires DW may be disposed as a double layer disposed on different layers with an insulating layer therebetween.

In this case, the fourth, second connection pad terminal ROW_PAD_B_4 and the third, second dummy pad terminal DM_TL_B_3 may be disposed on the same layer as the respective data lines of the double layer, respectively. For example, as illustrated in FIG. 11, the fourth, second connection pad terminal ROW_PAD_B_4 is disposed on the same layer as the data wire positioned at the top among the data wires of the double layer, and the third, second dummy pad terminal DM_TL_B_3 may be disposed on the same layer as the data wire positioned at the bottom among the data wires of the double layer. That is, the fourth, second connection pad terminal ROW_PAD_B_4 and the third, second dummy pad terminal DM_TL_B_3 are formed by the data wires DW (see FIG. 4), but the fourth, second connection pad terminal ROW_PAD_B_4 and the third, second dummy pad terminal DM_TL_B_3 may be disposed on different layers. However, exemplary embodiments are not limited thereto or thereby. For instance, the third, second dummy pad terminal DM_TL_B_3 may be formed on the same layer as one of the first gate wires GW1 and the second gate wires GW2 of a double layer structure.

In some exemplary embodiments, the fourth, second connection pad terminal ROW_PAD_B_4 and the third, second dummy pad terminal DM_TL_B_3 are disposed on different layers to prevent the fourth, second connection pad terminal ROW_PAD_B_4 and the third, second dummy pad terminal DM_TL_B_3 from being short-circuited with each other.

Accordingly, the plurality of first connection pad terminals ROW_PAD_A and the first dummy pad terminal DM_TL_A may be disposed on different layers or the plurality of second connection pad terminals ROW_PAD_B and the second dummy pad terminal DM_TL_B may be disposed on different layers such that the plurality of first connection pad terminals ROW_PAD_A and the first dummy pad terminals DM_TL_A or the plurality of second connection pad terminals ROW_PAD_B and the second dummy pad terminals DM_TL_B may be prevented from being short-circuited with each other.

Figure 14:
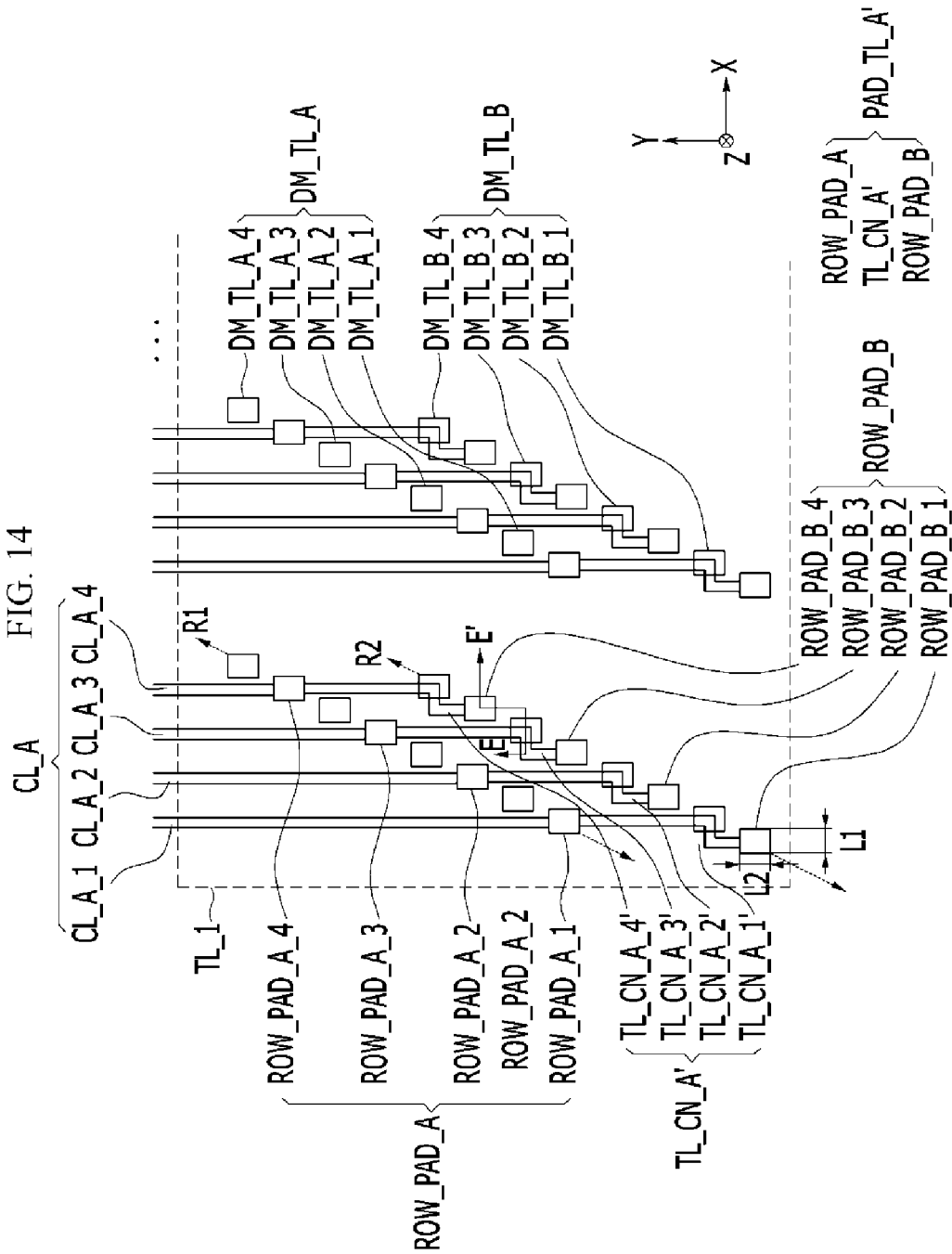
FIG. 14 is a diagram illustrating a modified example of a first pad terminal of the display device of FIG. 5 according to some exemplary embodiments.
Figure 15:
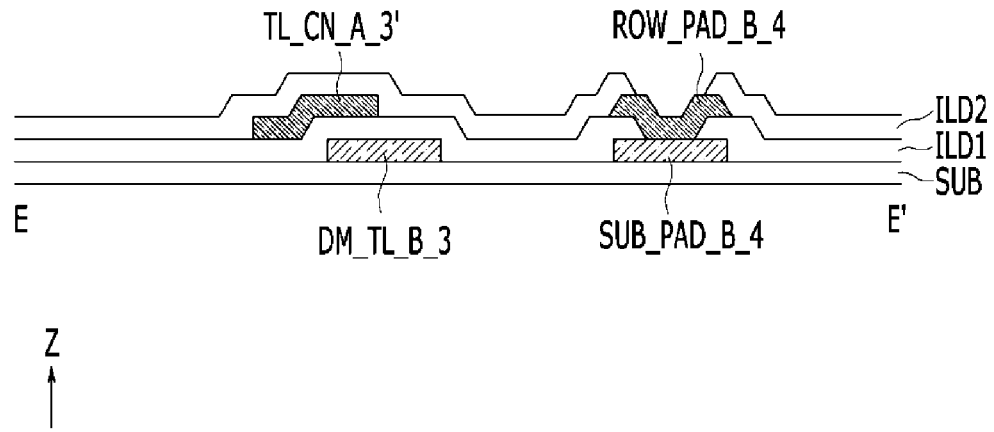
FIG. 15 is a cross-sectional view of the display device of FIG. 14 taken along sectional line E-E' of FIG. 14 according to some exemplary embodiments.

Hereinafter, a modified example of a layout structure of the first terminal connection lines TL_CN_A of the first pad terminals PAD_TL_A and the second dummy pad terminals DM_TL_B will be described with reference to FIGS. 14 and 15. When describing the first pad terminals PAD_TL_A' of FIG. 14, a detailed description for the same configuration as the first pad terminals PAD_TL_A described above will be omitted. In this manner, FIG. 14 is a diagram illustrating a modified example of a first pad terminal of the display device of FIG. 5 according to some exemplary embodiments. FIG. 15 is a cross-sectional view of the display device of FIG. 14 taken along sectional line E-E' of FIG. 14 according to some exemplary embodiments.

Referring to FIGS. 14 and 15, the first terminal connection line TL_CN_A' may be overlapped with the second dummy pad terminals DM_TL_B. For example, the third, first terminal connection line TL_CN_A_3' and the third, second dummy pad terminal DM_TL_B_3 may be overlapped with each other.

In this case, the third, first terminal connection line TL_CN_A_3' and the third, second dummy pad terminal DM_TL_B_3 are disposed on different layers, and, thus, the third, first terminal connection line TL_CN_A_3' and the third, second dummy pad terminal DM_TL_B_3 may be overlapped with each other. However, in FIGS. 14 and 15, the third, first terminal connection line TL_CN_A_3' is overlapped with the third, second dummy pad terminal DM_TL_B_3, but exemplary embodiments are not limited thereto or thereby. For instance, the third, first terminal connection line TL_CN_A_3' may be overlapped with the third, first dummy pad terminal DM_TL_A_3.

In some exemplary embodiments, as illustrated in FIG. 5, each of the first dummy pad terminals DM_TL_A and each of the second dummy pad terminals DM_TL_B may have a plate shape having a quadrangular plane. That is, when viewed from the plane, each of the first dummy pad terminals DM_TL_A and each of the second dummy pad terminals DM_TL_B may have a quadrangular plate shape.

However, shapes of the first dummy pad terminals DM_TL_A and the second dummy pad terminals DM_TL_B are not limited thereto or thereby, and may have various shapes.

Figure 16:
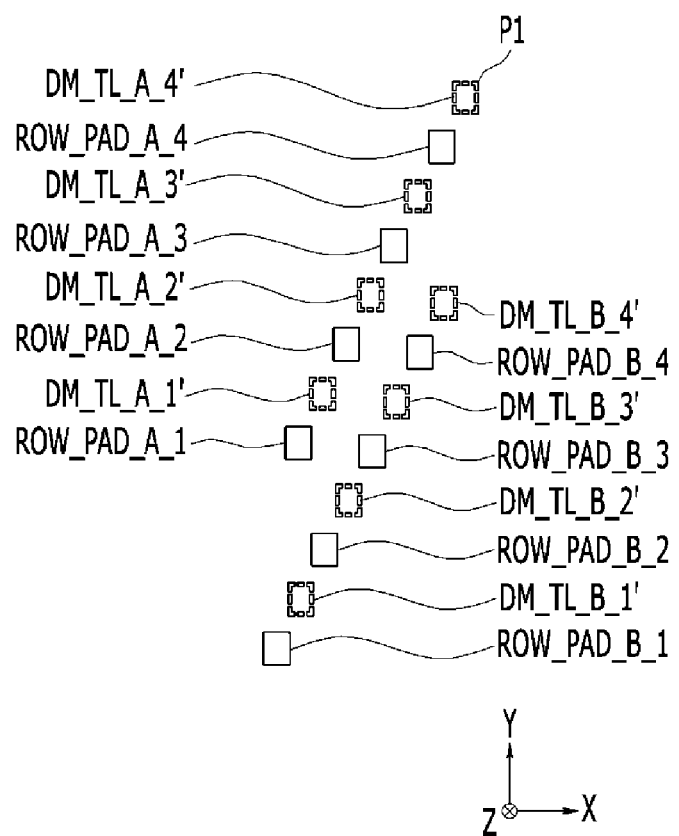
FIGS. 16, 17, and 18 are diagrams illustrating various shapes of first and second dummy pad terminals of the display device of FIG. 5 according to some exemplary embodiments.
Figure 17:
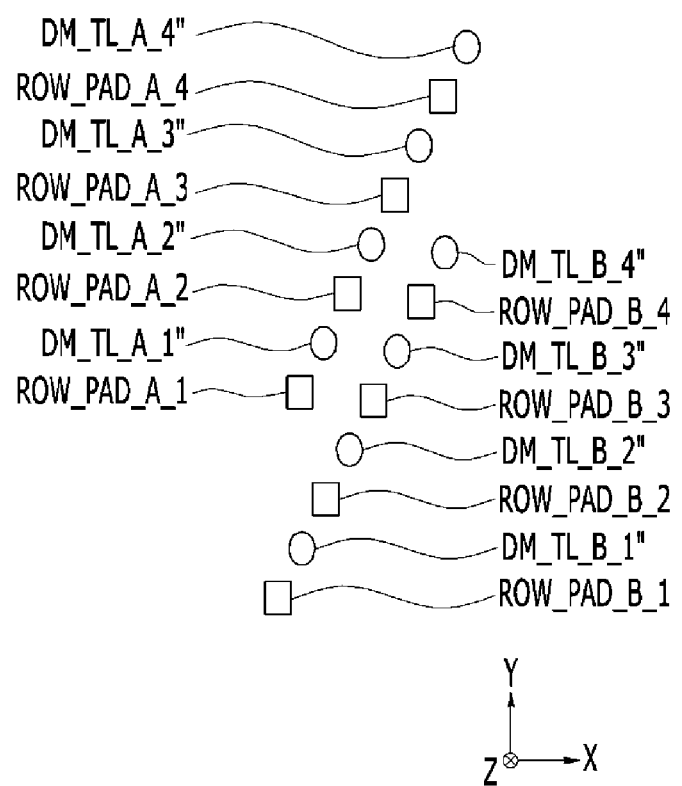
Figure 18:
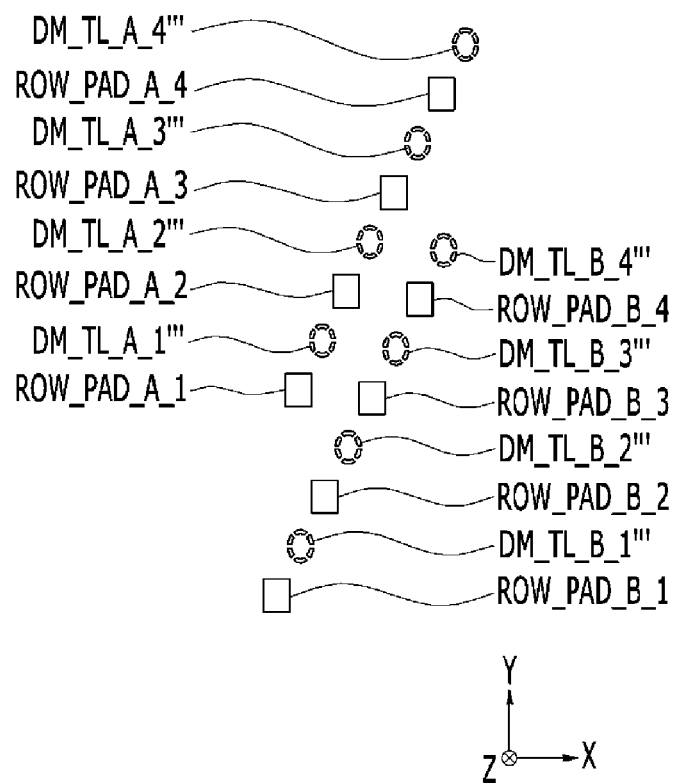

FIGS. 16, 17, and 18 are diagrams illustrating various shapes of first and second dummy pad terminals of the display device of FIG. 5 according to some exemplary embodiments.

Referring to FIG. 16, the first dummy pad terminals DM_TL_A' and the second dummy pad terminals DM_TL_B' may include a plurality of unit patterns P1 that are separated from each other. The plurality of unit patterns P1 are spaced apart from each other to have quadrangular shapes. When the first dummy pad terminals DM_TL_A' and the second dummy pad terminals DM_TL_B' have these shapes, when the substrate SUB and the printed circuit board 300 are coupled with each other, the first connection pad terminals ROW_PAD_A of the substrate SUB and the fifth connection pad terminals ROW_PAD_E (see FIG. 25) of the printed circuit board 300 may be accurately aligned. In this case, the first dummy pad terminals DM_TL_A' and the second dummy pad terminals DM_TL_B' of the substrate SUB may serve to guide a location of the first connection pad terminals ROW_PAD_A positioned therearound.

Referring to FIG. 17, the first dummy pad terminals DM_TL_A" and the second dummy pad terminals DM_TL_B" may have a plate shape having a circular or oval plane. That is, when viewed from the plane, the first dummy pad terminals DM_TL_A" and the second dummy pad terminals DM_TL_B" may have a circular or oval plate shape.

Referring to FIG. 18, the first dummy pad terminals DM_TL_A''' and the second dummy pad terminals DM_TL_B''' may include a plurality of unit patterns that are separated from each other similar to the first dummy pad terminals DM_TL_A' and the second dummy pad terminals DM_TL_B' of FIG. 16. However, in FIG. 18, the plurality of unit patterns is spaced apart from each other to have a circular shape or an oval shape. Similar to FIG. 16, in the case where the first dummy pad terminals DM_TL_A''' of FIG. 18 and the second dummy pad terminals DM_TL_B''' of FIG. 18 have the unit pattern shapes, when the substrate SUB and the printed circuit board 300 are coupled with each other, the first connection pad terminals ROW_PAD_A of the substrate SUB and the fifth connection pad terminals ROW_PAD_E (see FIG. 25) of the printed circuit board 300 may be accurately aligned with each other.

Hereinafter, a structure of the second pad terminals PAD_TL_B disposed in the second terminal area TL_2 will be described in detail with reference to FIGS. 19 to 22.

Figure 19:
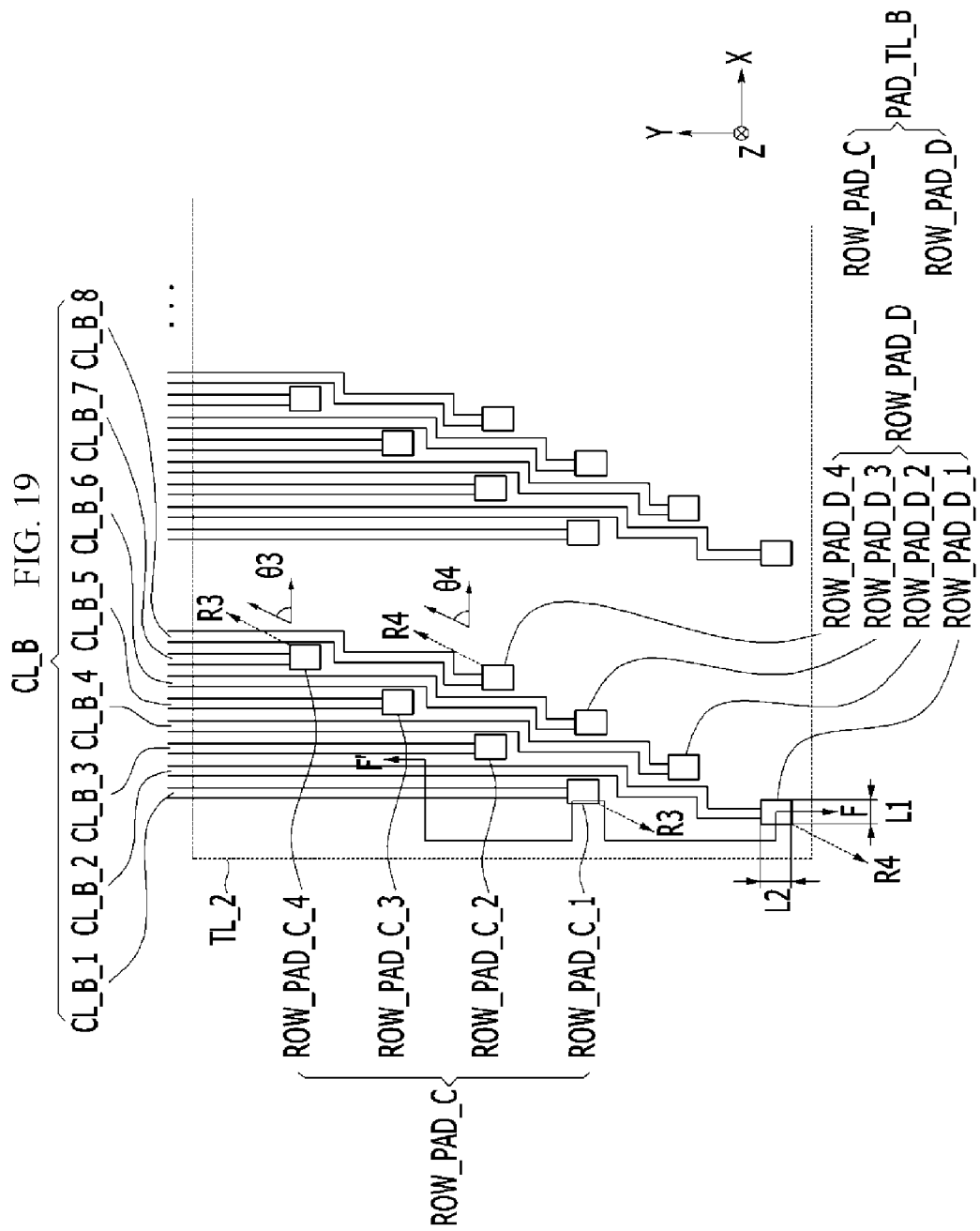
FIG. 19 is an enlarged diagram of a second terminal area of the display device of FIG. 1 according to some exemplary embodiments.
Figure 20:
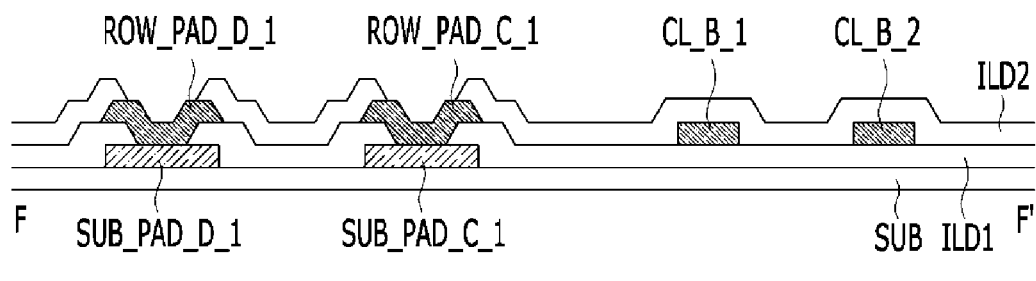
FIG. 20 is a cross-sectional view of the display device of FIG. 1 taken along sectional line F-F' of FIG. 19 according to some exemplary embodiments.
Figure 21:
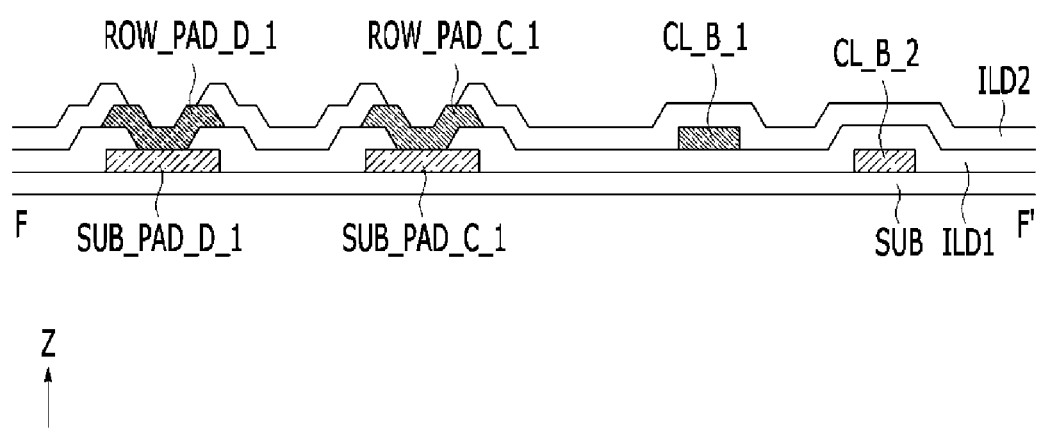
FIGS. 21 and 22 are cross-sectional views illustrating modified examples of a second connection wire of the display device of FIG. 20 according to some exemplary embodiments.
Figure 22:
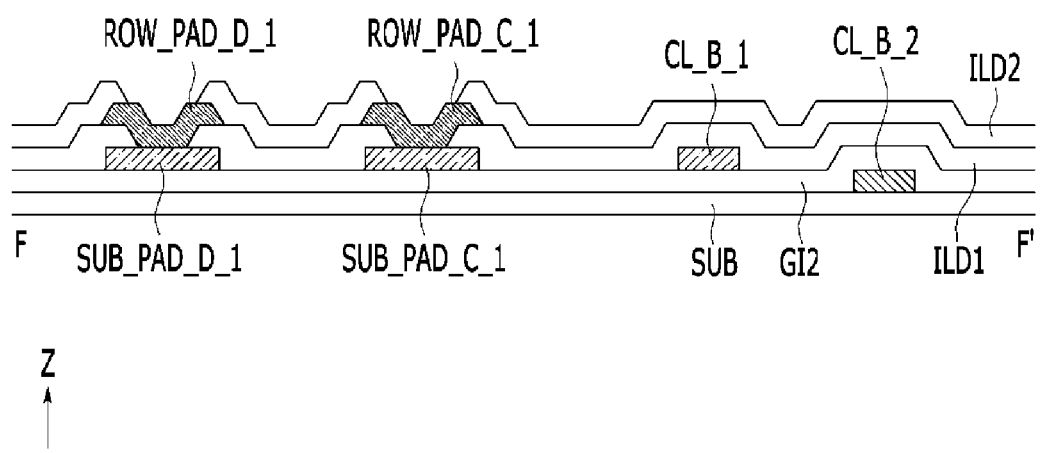

FIG. 19 is an enlarged diagram of a second terminal area of the display device of FIG. 1 according to some exemplary embodiments. FIG. 20 is a cross-sectional view of the display device of FIG. 1 taken along sectional line F-F' of FIG. 19 according to some exemplary embodiments. FIGS. 21 and 22 are cross-sectional views illustrating modified examples of a second connection wire of the display device of FIG. 20 according to some exemplary embodiments.

Referring to FIGS. 19 and 20, in the second terminal area TL_2, a plurality of second pad terminals PAD_TL_B may be disposed. In this case, the second terminal area TL_2 may be connected with the data wires DW (see FIG. 3) disposed in the display area DA through the second connection wires CL_B. The plurality of second pad terminals PAD_TL_B may be spaced apart from each other at determined intervals in the first direction in the second terminal area TL_2, respectively. The plurality of second pad terminals PAD_TL_B may include a plurality of third connection pad terminals ROW_PAD_C and a plurality of fourth connection pad terminals ROW_PAD_D, respectively.

The third connection pad terminals ROW_PAD_C may be disposed to be spaced apart from each other in one direction. In this case, the third connection pad terminals ROW_PAD_C may be arranged along a third column R3 that forms a third slope angle θ3 with the first direction. That is, the third connection pad terminals ROW_PAD_C may be arranged to be inclined at the third slope angle θ3 with the first direction. The third slope angle θ3 may be greater than 0° and less than 90°. Each of the third connection pad terminals ROW_PAD_C disposed in the second terminal area TL_2 may be arranged to be inclined in the same direction. That is, the third connection pad terminals ROW_PAD_C may be arranged to be inclined at the same angle based on an X-axis direction in the second terminal area TL_2. For example, as illustrated in FIG. 19, the third connection pad terminals ROW_PAD_C may be arranged to be inclined in an approximately 1 o'clock direction. However, exemplary embodiments are not limited thereto or thereby, as will become more apparent below.

FIG. 23 is a diagram illustrating a modified example of first and second terminal areas of the display device of FIG. 1 according to some exemplary embodiments.

As illustrated in FIG. 23, the plurality of third connection pad terminals ROW_PAD_C disposed in the second terminal area TL_2 may be disposed to be mirror images based on a center (or central axis) of the second terminal area TL_2. For example, the plurality of third connection pad terminals ROW_PAD_C at a left side based on the center of the second terminal area TL_2 may be arranged to be inclined in an approximately 1 o'clock direction and the plurality of third connection pad terminals ROW_PAD_C at a right side based on the center of the second terminal area TL_2 may be arranged to be inclined in an approximately 11 o'clock direction.

Adverting back to FIGS. 19 and 20, intervals among adjacent third connection pad terminals ROW_PAD_C may be the same as each other. For example, an interval between a first, third connection pad terminal ROW_PAD_C_1 and a second, third connection pad terminal ROW_PAD_C_2, an interval between the second, third connection pad terminal ROW_PAD_C_2 and a third, third connection pad terminal ROW_PAD_C_3, and an interval between the third, third connection pad terminal ROW_PAD_C_3 and the fourth, third connection pad terminal ROW_PAD_C_4 may be the same as each other. Herein, the intervals among the third connection pad terminals ROW_PAD_C represent distances that are spaced apart from each other along the third column R3.

The fourth connection pad terminals ROW_PAD_D may be spaced apart from the third connection pad terminal ROW_PAD_C in the second direction. Like the third connection pad terminals ROW_PAD_C, the fourth connection pad terminals ROW_PAD_D may be spaced apart from each other in one direction. In this case, the fourth connection pad terminals ROW_PAD_D may be arranged along a fourth column R4 that forms a fourth slope angle θ4 with the first direction. That is, the fourth connection pad terminals ROW_PAD_D may be arranged to be inclined at the fourth slope angle θ4 in the first direction. The fourth slope angle θ4 may be greater than 0° and less than 90°. Each of the fourth connection pad terminals ROW_PAD_D disposed in the second terminal area TL_2 may be arranged to be inclined in the same direction like the third connection pad terminal ROW_PAD_C. That is, the fourth connection pad terminals ROW_PAD_D may be arranged to be inclined at the same angle based on an X-axis direction in the second terminal area TL_2. For example, as illustrated in FIG. 19, the fourth connection pad terminals ROW_PAD_D may be arranged to be inclined in an approximately 1 o'clock direction. However, exemplary embodiments are not limited thereto or thereby, as will become more apparent below.

For instance, as illustrated in FIG. 23, the plurality of fourth connection pad terminals ROW_PAD_D disposed in the second terminal area TL_2 may be disposed to be mirror images of each other based on the center (or central axis) of the second terminal area TL_2. For example, the plurality of fourth connection pad terminals ROW_PAD_D at a left side based on the center of the second terminal area TL_2 may be arranged to be inclined in an approximately 1 o'clock direction and the plurality of fourth connection pad terminals ROW_PAD_D at a right side based on the center of the second terminal area TL_2 may be arranged to be inclined in an approximately 11 o'clock direction.

Referring again to FIGS. 19 and 20, in some exemplary embodiments, the third slope angle θ3 and the fourth slope angle θ4 may be the same as each other. Accordingly, the third connection pad terminals ROW_PAD_C and the fourth connection pad terminals ROW_PAD_D may be arranged to be inclined at the same angle in the first direction. However, the present invention is not limited thereto and the third slope angle θ3 and the fourth slope angle θ4 may be different from each other. That is, the third connection pad terminals ROW_PAD_C and the fourth connection pad terminals ROW_PAD_D may be arranged to be inclined at different angles in the first direction.

Intervals among adjacent fourth connection pad terminals ROW_PAD_D may be the same as each other. For example, an interval between a first, fourth connection pad terminal ROW_PAD_D_1 and a second, fourth connection pad terminal ROW_PAD_D_2, an interval between the second, fourth connection pad terminal ROW_PAD_D_2 and a third, fourth connection pad terminal ROW_PAD_D_3, and an interval between the third, fourth connection pad terminal ROW_PAD_D_3 and a fourth, fourth connection pad terminal ROW_PAD_D_4 may be the same as each other. Herein, the intervals among the fourth connection pad terminals ROW_PAD_D represent distances that are spaced apart from each other along the fourth column R4.

In some exemplary embodiments, the third connection pad terminals ROW_PAD_C and the fourth connection pad terminals ROW_PAD_D of the second terminal area TL_2 may be connected to the second connection wires CL_B, respectively. Unlike the second connection pad terminals ROW_PAD_B of FIG. 5, the fourth connection pad terminals ROW_PAD_D may be directly connected to the second connection wires CL_B.

For example, the first, third connection pad terminal ROW_PAD_C_1 may be connected with a first, second connection wire CL_B_1, and the first, fourth connection pad terminal ROW_PAD_D_1 may be connected with a second, second connection wire CL_B_2. The second, third connection pad terminal ROW_PAD_C_2 may be connected with a third, second connection wire CL_B_3 and the second, fourth connection pad terminal ROW_PAD_D_2 may be connected with a fourth, second connection wire CL_B_4. The third, third connection pad terminal ROW_PAD_C_3 may be connected with a fifth, second connection wire CL_B_5 and the third, fourth connection pad terminal ROW_PAD_D_3 may be connected with a sixth, second connection wire CL_B_6. The fourth, third connection pad terminal ROW_PAD_C_4 may be connected with a seventh, second connection wire CL_B_7 and the fourth, fourth connection pad terminal ROW_PAD_D_4 may be connected with an eighth, second connection wire CL_B_8.

Referring to FIG. 20, each of the plurality of second connection wires CL_B may be disposed on the same layer. For example, the first, second connection wire CL_B_1 and the second, second connection wire CL_B_2 that are adjacent to each other may be disposed on the same layer. Further, the third connection pad terminals ROW_PAD_C and the fourth connection pad terminals ROW_PAD_D may be disposed on the same layer as the plurality of second connection wires CL_B. For example, the first, third connection pad terminal ROW_PAD_C_1 and the first, fourth connection pad terminal ROW_PAD_D_1 may be disposed on the same layer as the first, second connection wire CL_B_1 and the second, second connection wire CL_B_2.

In some exemplary embodiments, the third connection pad terminals ROW_PAD_C, the fourth connection pad terminals ROW_PAD_D, and the plurality of second connection wires CL_B may be disposed on the same layer as the data lines DA1-DAm (see FIG. 3) disposed in the display area DA. However, the interlayer structure of the plurality of second connection wires CL_B is not limited thereto or thereby. For instance, the plurality of second connection wires CL_B may be disposed on different layers.

Referring to FIG. 21, a pair of adjacent second connection wires CL_B among the plurality of second connection wires CL_B may be disposed on different layers. For example, the first, second connection wire CL_B_1 and the second, second connection wire CL_B_2 that are adjacent to each other may be disposed on different layers. The first, second connection wire CL_B_1 may be disposed on the same layer as the first, third connection pad terminal ROW_PAD_C_1 and the first, fourth connection pad terminal ROW_PAD_D_1. On the other hand, the second, second connection wire CL_B_2 may be disposed on the same layer as a first, third sub pad wire SUB_PAD_C_1 and a first, fourth sub pad wire SUB_PAD_D_1 positioned below the first, third connection pad terminal ROW_PAD_C_1 and the first, fourth connection pad terminal ROW_PAD_D_1, respectively. In this case, the first, third sub pad wire SUB_PAD_C_1 and the first, fourth sub pad wire SUB_PAD_D_1 may be disposed on the same layer as the second gate wires GW2 disposed in the display area DA (see FIGS. 3 and 4).

Referring to FIG. 22, like FIG. 21, a pair of adjacent second connection wires CL_B among the plurality of second connection wires CL_B may be disposed on different layers. For example, the first, second connection wire CL_B_1 and the second, second connection wire CL_B_2 that are adjacent to each other may be disposed on different layers. In more detail, the first, second connection wire CL_B_1 may be disposed on the same layer as the first, third sub pad wire SUB_PAD_C_1 and the first, fourth sub pad wire SUB_PAD_D_1. On the other hand, the second, second connection wire CL_B_2 may be positioned below the first, second connection wire CL_B_1. In this case, the first, second connection wire CL_B_1 may be disposed on the same layer as the second gate wires GW2 (see FIG. 4) and the second connection wire CL_B_2 is disposed on the same layer as the first gate wires GW1 (see FIG. 4).

Hereinafter, the printed circuit board 300 coupled with the display device according to some exemplary embodiments will be described with reference to FIGS. 24 to 27.

Figure 24:
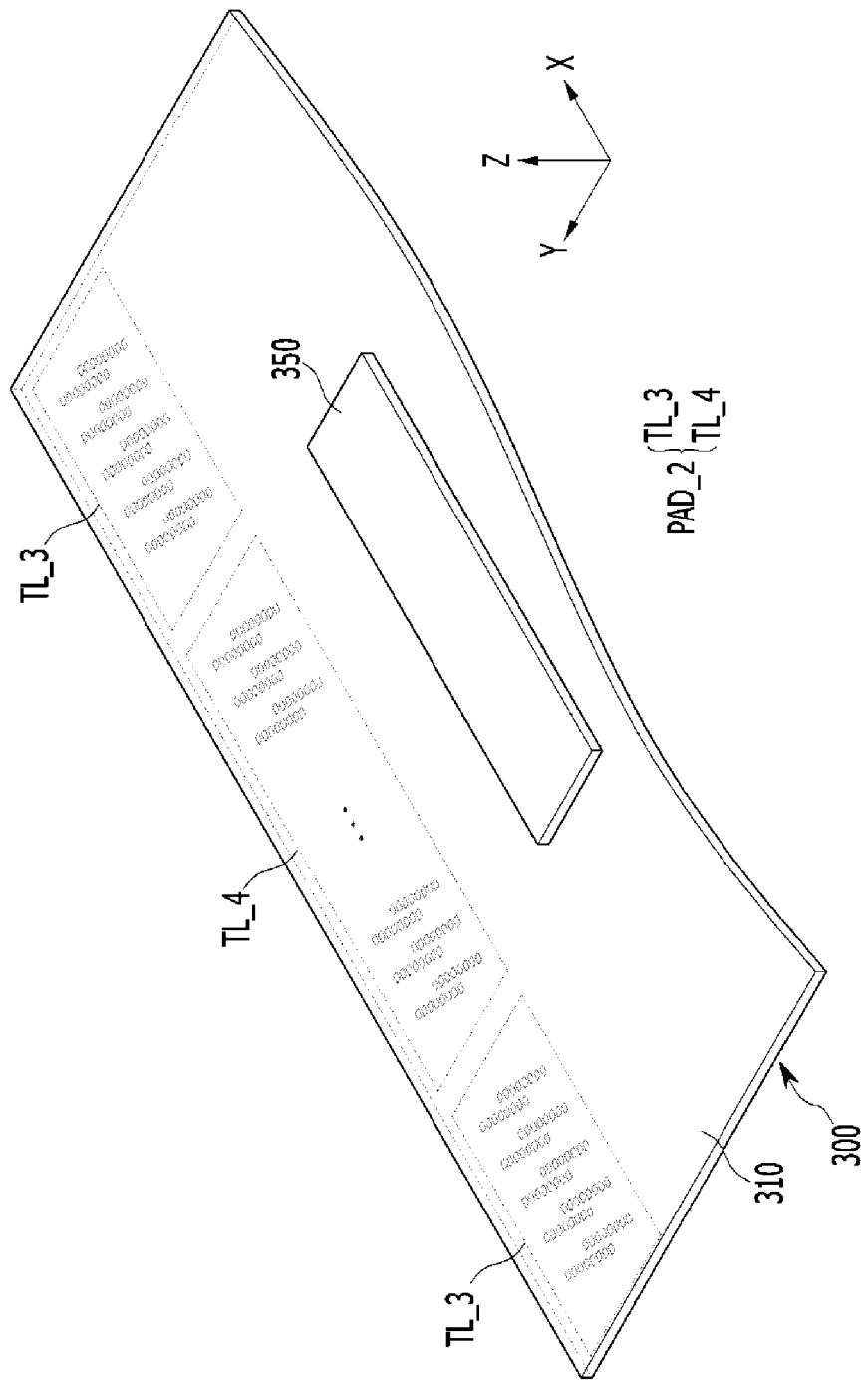
FIG. 24 is a schematic perspective view of a printed circuit board coupled to the display device of FIG. 1 according to some exemplary embodiments.
Figure 25:
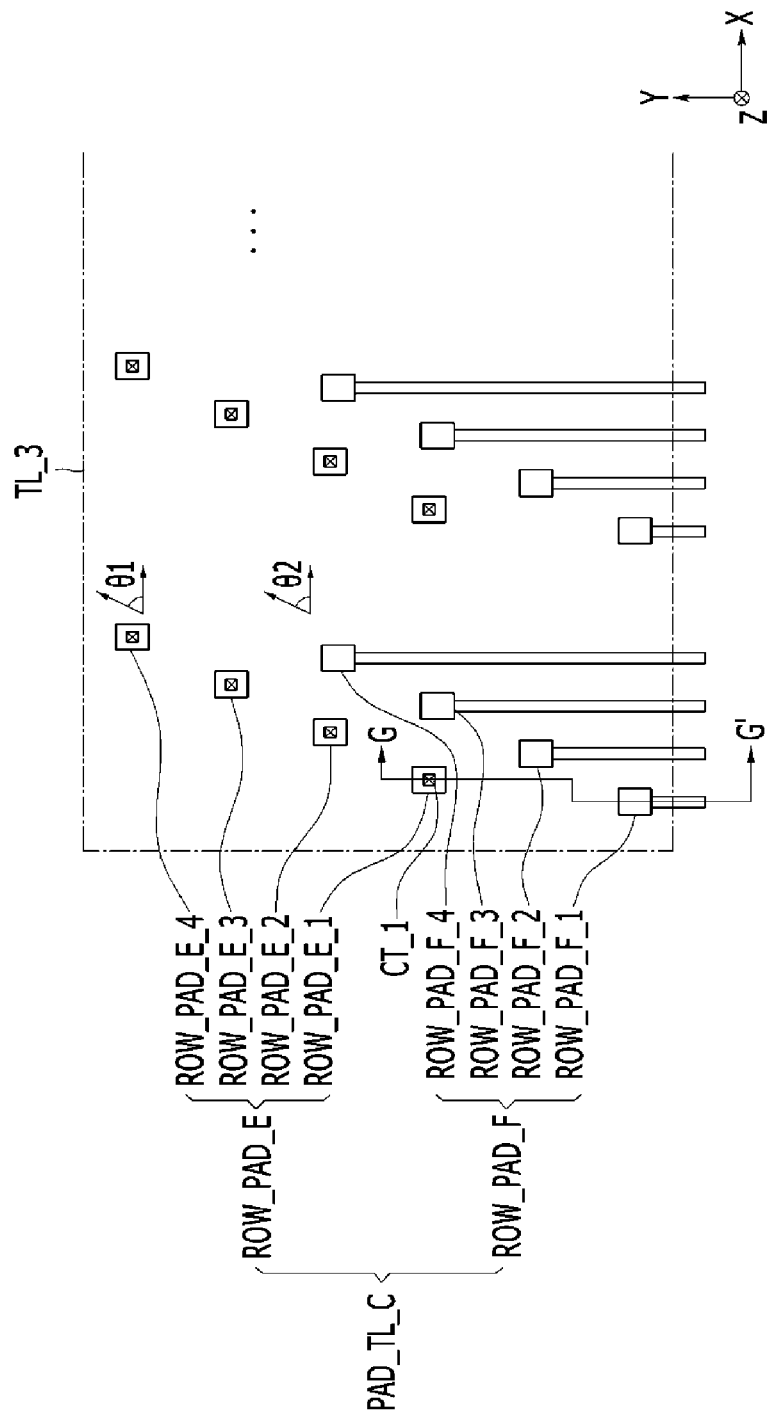
FIG. 25 is an enlarged diagram of a third terminal area of the display device of FIG. 24 according to some exemplary embodiments.
Figure 26:
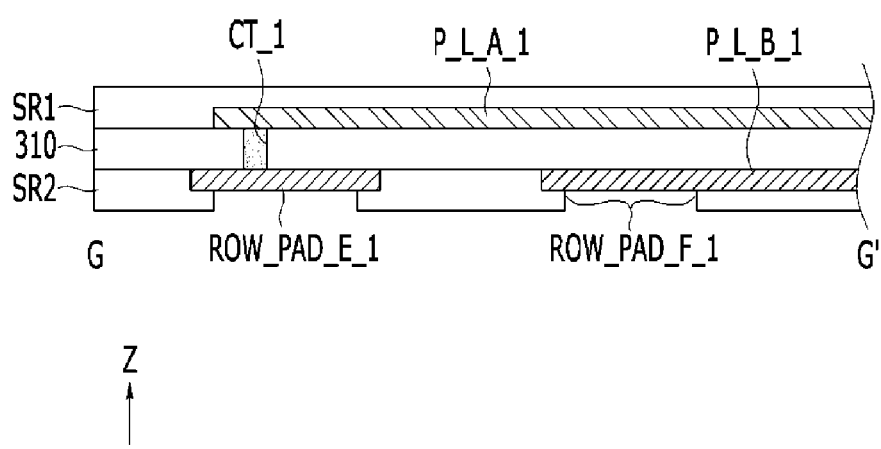
FIG. 26 is a cross-sectional view of the display device of FIG. 24 taken along sectional line G-G' of FIG. 25 according to some exemplary embodiments.
Figure 27:
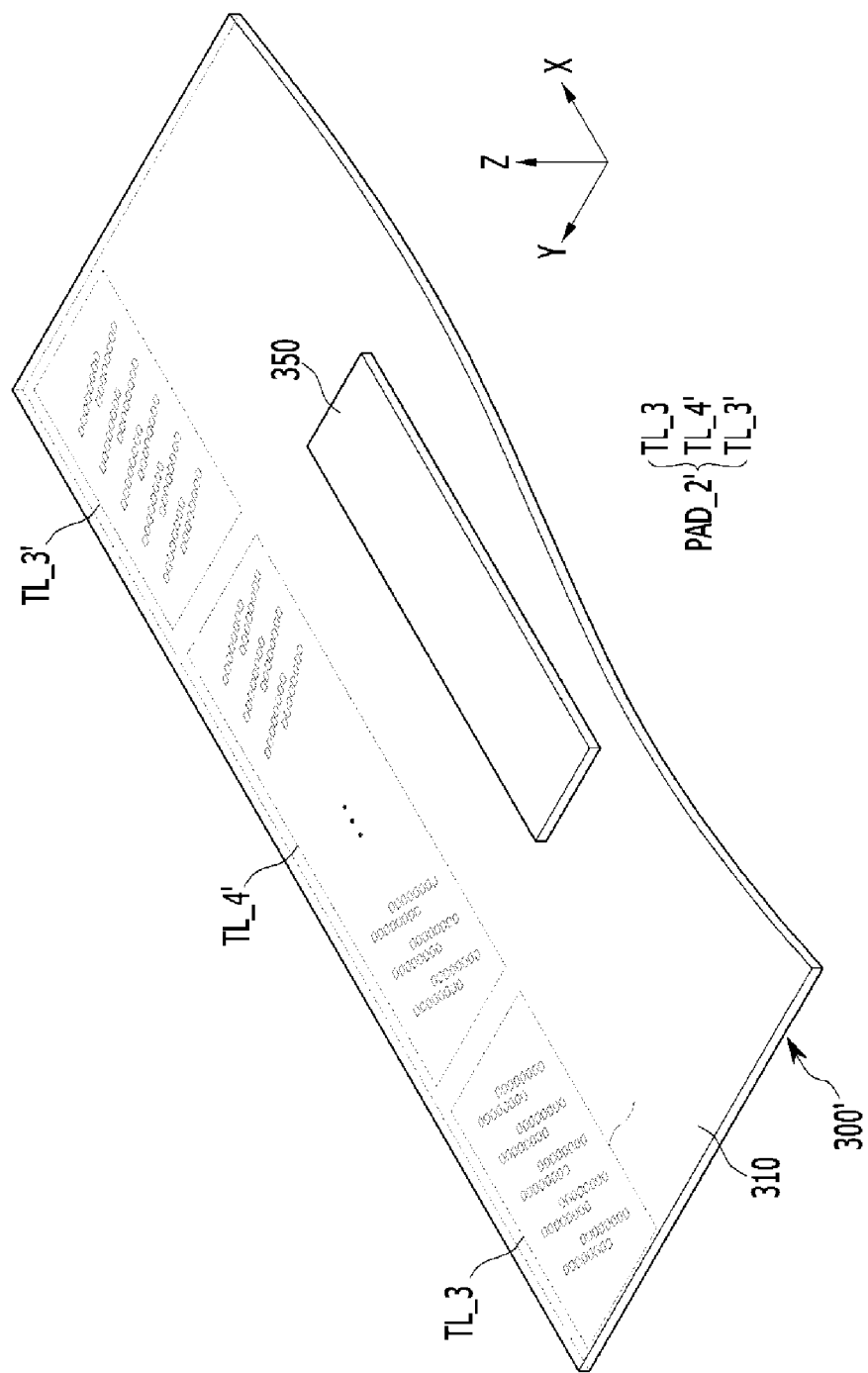
FIG. 27 is a diagram illustrating a modified example of the printed circuit board of the display device of FIG. 24 according to some exemplary embodiments.

FIG. 24 is a schematic perspective view of a printed circuit board coupled to the display device of FIG. 1 according to some exemplary embodiments. FIG. 25 is an enlarged diagram of a third terminal area of the display device of FIG. 24 according to some exemplary embodiments. FIG. 26 is a cross-sectional view of the display device of FIG. 24 taken along sectional line G-G' of FIG. 25 according to some exemplary embodiments. FIG. 27 is a diagram illustrating a modified example of the printed circuit board of the display device of FIG. 24 according to some exemplary embodiments.

Referring to FIG. 24, the printed circuit board 300 may include a base film 310, a second pad PAD_2, and a driving chip 350.

The second pad PAD_2 may be disposed at one end of the flexible base film 310. According to some exemplary embodiments, the second pad PAD_2 may have a shape corresponding to the shape of the first pad PAD_1 of the aforementioned substrate SUB. The second pad PAD_2 of the printed circuit board 300 and the first pad PAD_1 of the substrate SUB have the corresponding shapes, and the first pad PAD_1 and the second pad PAD_2 may be easily coupled with each other.

The second pad PAD_2 may include a third terminal area TL_3 and a fourth terminal area TL_4. The third terminal area TL_3 and the fourth terminal area TL_4 represent areas positioned on the base film 310. The third terminal area TL_3 and the fourth terminal area TL_4 may be arranged on the base film 310 in parallel in the first direction.

According to some exemplary embodiments, the third terminal areas TL_3 may be disposed at two sides of the fourth terminal area TL_4, respectively. However, exemplary embodiments are not limited thereto or thereby. For instance, the third terminal area TL_3 may be disposed between a pair of fourth terminal areas TL_4.

The arrangement of the third terminal area TL_3 and the fourth terminal area TL_4 is determined according to the arrangement of the first terminal area TL_1 and the second terminal area TL_2 disposed on the substrate SUB. For example, when the second terminal areas TL_2 are disposed at two sides of the first terminal area TL_1, respectively, the fourth terminal area TL_4 may be disposed at two sides of the third terminal area TL_3, respectively. When the second terminal area TL_2 is disposed between a pair of first terminal areas TL_1, the fourth terminal area TL_4 may be disposed between a pair of third terminal areas TL_3.

Referring to FIGS. 25 and 26, the third terminal area TL_3 is an area corresponding to the first terminal area TL_1 of the substrate SUB, and, in the third terminal area TL_3, a plurality of third pad terminals PAD_TL_C may be disposed. The plurality of third pad terminals PAD_TL_C may be disposed with the same pattern as the first pad terminals PAD_TL_A disposed in the first terminal area TL_1.

The plurality of third pad terminals PAD_TL_C may include fifth connection pad terminals ROW_PAD_E and sixth connection pad terminals ROW_PAD_F, respectively.

In some exemplary embodiments, the fifth connection pad terminal ROW_PAD_E may be spaced apart from each other in one direction. In this case, the fifth connection pad terminals ROW_PAD_E may be arrange to be inclined at a first slope angle θ1 with the first direction. That is, the fifth connection pad terminals ROW_PAD_E may be arranged to be inclined at the same angle as the first connection pad terminals ROW_PAD_A of the substrate SUB. In this case, the first slope angle θ1 may be greater than 0° and less than 90°.

Intervals among adjacent fifth connection pad terminal ROW_PAD_E may be the same as each other. For example, an interval between a first, fifth connection pad terminal ROW_PAD_E_1 and a second, fifth connection pad terminal ROW_PAD_E_2, an interval between the second, fifth connection pad terminal ROW_PAD_E_2 and a third, fifth connection pad terminal ROW_PAD_E_3, and an interval between the third, fifth connection pad terminal ROW_PAD_E_3 and a fourth, fifth connection pad terminal ROW_PAD_E_4 may be the same as each other. In this case, intervals among adjacent fifth connection pad terminals ROW_PAD_E may be arranged equally to the intervals of the first connection pad terminals ROW_PAD_A. The fifth connection pad terminals ROW_PAD_E may have a substantially quadrangular shape as the area that is electrically in contact with the first connection pad terminals ROW_PAD_A of the substrate SUB.

The sixth connection pad terminals ROW_PAD_F may be spaced apart from the fifth connection pad terminals ROW_PAD_E in the second direction. Like the fifth connection pad terminals ROW_PAD_E, the sixth connection pad terminals ROW_PAD_F may be spaced apart from each other in one direction. In this case, the sixth connection pad terminals ROW_PAD_F may form a second slope angle θ2 with the first direction. That is, the sixth connection pad terminals ROW_PAD_F may be arranged to be inclined at the second slope angle θ2 with the first direction. That is, the sixth connection pad terminals ROW_PAD_F may be arranged to be inclined at the same angle as the second connection pad terminals ROW_PAD_B of the substrate SUB. In the case, the second slope angle θ2 may be greater than 0° and less than 90°.

In some exemplary embodiments, like the first connection pad terminals ROW_PAD_A and the second connection pad terminals ROW_PAD_B of the substrate SUB, the first slope angle θ1 and the second slope angle θ2 may be the same as each other in association with the fifth connection pad terminals ROW_PAD_E and the sixth connection pad terminals ROW_PAD_F, respectively. Accordingly, each of the fifth connection pad terminals ROW_PAD_E and the sixth connection pad terminals ROW_PAD_F may be arranged to be inclined at the same angle in the first direction. However, exemplary embodiments are not limited thereto or thereby. For instance, the first slope angle θ1 and the second slope angle θ2 may be different from each other. Accordingly, the fifth connection pad terminals ROW_PAD_E and the sixth connection pad terminals ROW_PAD_F may be arranged to be inclined at different angles in the first direction.

Intervals among adjacent sixth connection pad terminals ROW_PAD_F may be the same as each other. For example, an interval between a first, sixth connection pad terminal ROW_PAD_F_1 and a second, sixth connection pad terminal ROW_PAD_F_2, an interval between the second, sixth connection pad terminal ROW_PAD_F_2 and a third, sixth connection pad terminal ROW_PAD_F_3, and an interval between the third, sixth connection pad terminal ROW_PAD_F_3 and a fourth, sixth connection pad terminal ROW_ PAD_F_4 may be the same as each other. The sixth connection pad terminals ROW_PAD_F may have a substantially quadrangular shape as the area that is electrically in contact with the second connection pad terminals ROW_PAD_B of the substrate SUB.

In some exemplary embodiments, a first terminal wire P_L_A_1 and a second terminal wire P_L_B_1 may be disposed at two opposing sides based on the base film 310 in the printed circuit board 300. The first terminal wire P_L_A_1 may be positioned on the base film 310 and the second terminal wire P_L_B_1 may be positioned below the base film 310. In this case, the first terminal wire P_L_A_1 and the second terminal wire P_L_B_1 may be electrically connected with the driving chip 350, respectively.

On the first terminal wire P_L_A_1, a first protective layer SR1 may be disposed, and on the second terminal wire P_L_B_1, a second protective layer SR2 may be disposed. In this case, the first protective layer SR1 and the second protective layer SR2 may be solder resists.

The first, fifth connection pad terminal ROW_PAD_E_1 and the first, sixth connection pad terminal ROW_PAD_F_1 may be formed on the same layer as the second terminal wire P_L_B_1. The first, fifth connection pad terminal ROW_PAD_E_1 and the first, sixth connection pad terminal ROW_PAD_F_1 may be formed by removing a part of the second protective layer SR2 to expose a part of the second terminal wire P_L_B_1. In this case, the first, fifth connection pad terminal ROW_PAD_E_1 and the first, sixth connection pad terminal ROW_PAD_F_1 are spaced apart from each other.

In this case, the first, fifth connection pad terminal ROW_PAD_E_1 may be electrically connected with the first terminal wire P_L_A_1 through a first contact hole CT_1 formed in the base film 310. When viewed from the plane, the first contact hole CT_1 may be overlapped with the first, fifth connection pad terminal ROW_PAD_E_1. In this case, in the first contact hole CT_1, the same metal as the first terminal wire P_L_A_1 may be filled or metal configuring the first, fifth connection pad terminal ROW_PAD_E_1 may be filled. The first, sixth connection pad terminal ROW_PAD_F_1 may be formed as the same metal layer as the second terminal wire P_L_B_1. In some exemplary embodiments, the first, sixth connection pad terminal ROW_PAD_F_1 may correspond to an area where a part of the second terminal wire P_L_B_1 is exposed.

Referring to FIG. 24, the fourth terminal area TL_4 is an area corresponding to the second terminal area TL_2 of the substrate SUB, and in the fourth terminal area TL_4, a plurality of fourth pad terminals (not illustrated) may be disposed. The plurality of fourth pad terminals may be disposed with the same pattern as the second pad terminals PAD_TL_B disposed in the second terminal area TL_2. In this case, the plurality of fourth pad terminals may include a similar structure to the plurality of third pad terminals PAD_TL_C.

Hereinafter, a modified example of the printed circuit board will be described with reference to FIG. 27.

In FIG. 24, each of the third pad terminals PAD_TL_C and the fourth pad terminals PAD_TL_D disposed in the third terminal area TL_3 and the fourth terminal area TL_4, respectively, may be disposed to be inclined at the same angle with the first direction. For example, the third pad terminals PAD_TL_C and the fourth pad terminals PAD_TL_D may be disposed to be inclined in an approximately 1 o'clock direction.

However, in the modified example of the printed circuit board 300' of FIG. 27, the printed circuit board 300' may be disposed with patterns corresponding to the first pad terminals PAD_TL_A of the first terminal areas TL_1 and TL_1' and the second pad terminals PAD_TL_B of the second terminal area TL_2' of FIG. 23 described above. That is, the third pad terminals PAD_TL_C positioned at a left side of the fourth terminal area TL_4' may be disposed to be inclined in the approximately 1 o'clock direction, and the third pad terminals PAD_TL_C positioned at a right side of the fourth terminal area TL_4' may be disposed to be inclined in an approximately 11 o'clock direction.

The plurality of fourth pad terminals PAD_TL_D disposed in the fourth terminal area TL_4' may be disposed to be mirror images to each other based on the center (or central axis) of the fourth terminal area TL_4'. For example, the plurality of fourth pad terminals PAD_TL_D at a left side based on the center of the fourth terminal area TL_4' may be arranged to be inclined in an approximately 1 o'clock direction and the plurality of fourth pad terminals PAD_TL_D at the right side based on the center of the fourth terminal area TL_4' may be arranged to be inclined in an approximately 11 o'clock direction.

Hereinafter, a state where the first terminal area TL_1 and the third terminal area TL_3 are coupled with each other will be described with reference to FIGS. 28 and 29.

Figure 28:
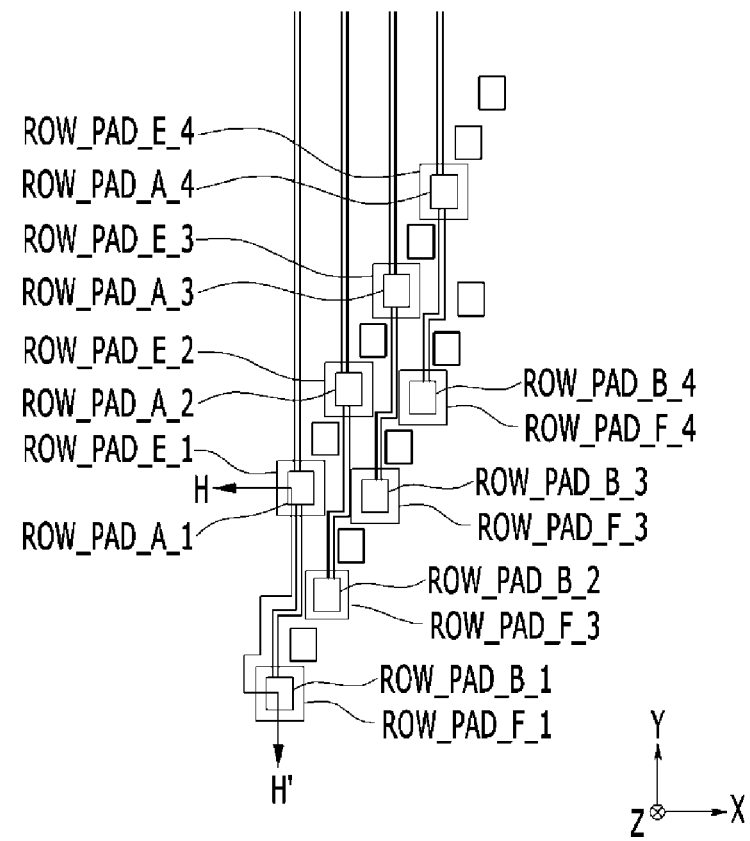
FIG. 28 is a diagram schematically illustrating a display device including a first terminal area formed on a substrate and a third terminal area formed on a printed circuit board that are coupled to one another according to some exemplary embodiments.
Figure 29:
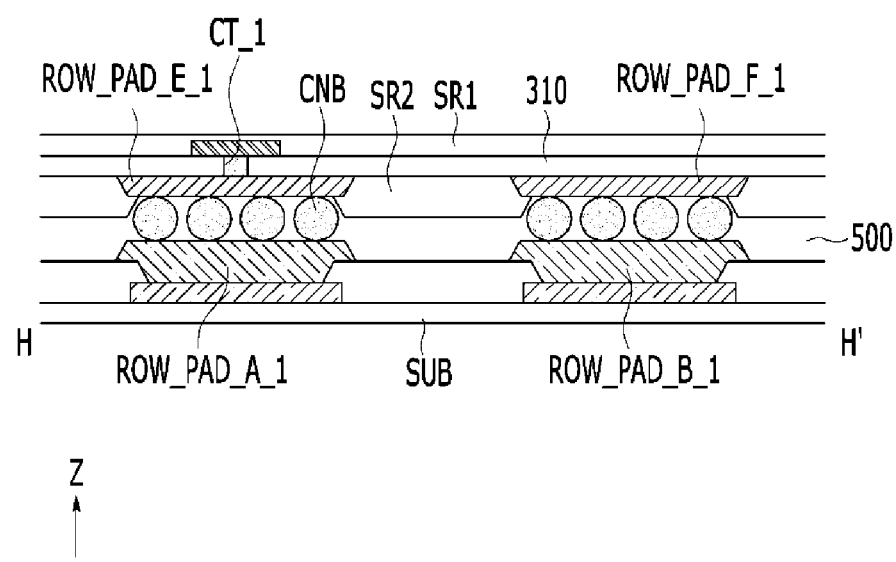
FIG. 29 is a cross-sectional view of the display device of FIG. 28 taken along sectional line H-H' according to some exemplary embodiments.

FIG. 28 is a diagram schematically illustrating a display device including a first terminal area formed on a substrate and a third terminal area formed on a printed circuit board that are coupled to one another according to some exemplary embodiments. FIG. 29 is a cross-sectional view of the display device of FIG. 28 taken along sectional line H-H' of FIG. 28 according to some exemplary embodiments.

On the first pad terminals PAD_TL_A (see FIG. 5), the third pad terminals PAD_TL_C (see FIG. 14) may be disposed to be overlapped with each other. That is, on the first connection pad terminals ROW_PAD_A, the fifth connection pad terminals ROW_PAD_E may be overlapped, and on the second connection pad terminals ROW_PAD_B, the sixth connection pad terminals ROW_PAD_F may be overlapped.

In addition, a conductive adhesive film 500 may be disposed between the first terminal areas TL_1 and the third terminal area TL_3. The conductive adhesive film 500 may electrically connect the first connection pad terminals ROW_PAD_A and the fifth connection pad terminals ROW_PAD_E. In addition, the conductive adhesive film 500 may electrically connect the second connection pad terminals ROW_PAD_B and the sixth connection pad terminals ROW_PAD_F. Through a plurality of conductive balls CNB included in the conductive adhesive film 500, the first connection pad terminals ROW_PAD_A and the fifth connection pad terminals ROW_PAD_E may be electrically connected to each other. In addition, the second connection pad terminals ROW_PAD_B and the sixth connection pad terminals ROW_PAD_F are electrically connected to each other.

According to some exemplary embodiments, in the first pad PAD_1, the first terminal areas TL_1 and the second terminal area TL_2 are formed, and the plurality of first pad terminals PAD_TL_A disposed in the first terminal areas TL_1 include a plurality of first connection pad terminals ROW_PAD_A and first dummy pad terminals DM_TL_A, respectively, and the plurality of first connection pad terminals ROW_PAD_A and first dummy pad terminals DM_TL_A may be disposed on different layers. That is, the first connection pad terminals ROW_PAD_A and the first dummy pad terminals DM_TL_A may be disposed on different layers on the substrate SUB.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:
1. A display device, comprising:
 a substrate comprising:
  a display area to display an image; and
  a pad area outside the display area; and a first pad in the pad area, the first pad comprising first pad terminals extending parallel to one another in a first direction;

wherein the first pad terminals comprise:

first connection pad terminals arranged along a first column that forms a first slope angle with the first direction;

second connection pad terminals spaced apart from the first connection pad terminals and arranged along a second column that forms a second slope angle with the first direction; and a first dummy pad terminal between a pair of adjacent first connection pad terminals among the first connection pad terminals along the first column, and wherein the first dummy pad terminal and the first connection pad terminals are in different layers than one another.

2. The display device of claim 1, wherein:

each of the first pad terminals further comprises a second dummy pad terminal disposed between a pair of adjacent second connection pad terminals among the second connection pad terminals in the second column; and the second dummy pad terminal and the second connection pad terminals are in different layers than one another.

3. The display device of claim 2, wherein:

at least one of the first dummy pad terminal and the second dummy pad terminal has a plate shape having a quadrangular plane.

4. The display device of claim 2, wherein:

at least one of the first dummy pad terminal and the second dummy pad terminal has a plate shape having a circular plane.

5. The display device of claim 2, wherein:

at least one of the first dummy pad terminal and the second dummy pad terminal has a plate shape having an oval plane.

6. The display device of claim 2, wherein:

at least one of the first dummy pad terminal and the second dummy pad terminal comprises unit patterns; and the unit patterns are spaced apart from one another in a circular pattern.

7. The display device of claim 2, wherein:

at least one of the first dummy pad terminal and the second dummy pad terminal comprises unit patterns; and the unit patterns are spaced apart from one another in a quadrangular pattern.

8. The display device of claim 2, wherein:

the first pad terminals further comprise first terminal connection lines;

each first terminal connection line among the first terminal connection lines respectively connects a first connection pad terminal among the first connection pad terminals and a second connection pad terminal among the second connection pad terminals to one another; and each of the first terminal connection lines has at least one bent shape.

9. The display device of claim 8, wherein:

the first terminal connection lines are in a same layer as the first connection pad terminals.

10. The display device of claim 9, wherein:

at least one of the first terminal connection lines overlaps at least one of the first dummy pad terminal and the second dummy pad terminal.

11. The display device of claim 1, wherein:

the first slope angle is equivalent to the second slope angle.

12. The display device of claim 11, wherein:

the first slope angle and the second slope angle are greater than 020 and smaller than 90°.

13. The display device of claim 1, wherein:

the first pad further comprises second pad terminals in a second terminal area spaced apart from a first terminal area in which the first pad terminals are disposed.

14. The display device of claim 13, wherein the second pad terminals comprise:

third connection pad terminals arranged along a third column that forms a third slope angle with the first direction; and fourth connection pad terminals spaced apart from the third connection pad terminals, the fourth connection pad terminals being arranged along a fourth column that forms a fourth slope angle with the first direction.

15. The display device of claim 14, wherein:

the third slope angle is equivalent to the fourth slope angle.

16. The display device of claim 15, wherein:

the third slope angle and the fourth slope angle are greater than 0° and smaller than 90°.

17. The display device of claim 16, wherein:

the first slope angle is equivalent to the third slope angle.

18. The display device of claim 13, wherein:

the first terminal area and the second terminal area are parallel to one another in the first direction.

19. The display device of claim 1, wherein:

each of the first connection pad terminals and each of the second connection pad terminals has a plate shape having a quadrangular plane.

20. The display device of claim 19, wherein:

the quadrangle comprises:

first sides parallel with the first direction; and second sides adjacent to the first sides, the second sides being parallel with the second direction, which crosses the first direction; and the second sides are respectively longer than the first sides.

21. The display device of claim 1, further comprising:

data lines disposed on the display area; and gate lines disposed on the display area, the gate lines respectively crossing the data lines.

22. The display device of claim 21, wherein:

the first connection pad terminals and the data lines are in a same layer as one another; and the first dummy pad terminal and the gate lines are in a same layer as one another.

23. The display device of claim 22, wherein:

each of the gate lines comprises a first gate member and a second gate member on the first gate member; and the first dummy pad terminal and any one of the first gate members and the second gate members are in a same layer as one another.

24. The display device of claim 21, wherein:

each of the data lines comprises a first data member and a second data member on the first data member; and the first connection pad terminal, the first dummy pad terminal, and any one of the first gate members and the second gate members are in a same layer as one another.

25. The display device of claim 1, further comprising:
a printed circuit board comprising a base film; and
a second pad on a first side of the base film, the second pad having a shape corresponding to the first pad,
wherein the second pad and the first pad are coupled to one another.

26. The display device of claim 25, wherein:
the printed circuit board further comprises a driving chip on a second side of the base film, the second side opposing the first side.

27. The display device of claim 25, wherein:
the base film is flexible.

* * * * *